（12）United States Patent
Matsuzaki

(10) Patent No.: US 8,842,459 B2
(45) Date of Patent: Sep. 23, 2014

(54) SEMICONDUCTOR DEVICE

(75) Inventor: Takanori Matsuzaki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 27 days.

(21) Appl. No.: 13/489,628

(22) Filed: Jun. 6, 2012

(65) Prior Publication Data

US 2012/0236621 A1 Sep. 20, 2012

Related U.S. Application Data

(63) Continuation of application No. 12/570,619, filed on Sep. 30, 2009, now Pat. No. 8,199,551.

(30) Foreign Application Priority Data

Oct. 2, 2008 (JP) .................. 2008-257339

(51) Int. Cl.
*G11C 5/06* (2006.01)
*H01L 27/108* (2006.01)
*G11C 11/402* (2006.01)

(52) U.S. Cl.
CPC ........ *H01L 27/108* (2013.01); *H01L 27/10894* (2013.01); *G11C 11/4023* (2013.01)
USPC ........................................... 365/71

(58) Field of Classification Search
USPC ........ 365/72, 149, 175, 105, 49, 187, 189.09, 365/189.05, 201, 229, 226, 227, 172, 156
See application file for complete search history.

(56) References Cited

U.S. PATENT DOCUMENTS

| 5,300,800 A | 4/1994 | Bronner et al. |
| 5,828,429 A | 10/1998 | Takemura |
| 5,953,249 A | 9/1999 | Van der Wagt |
| 6,023,308 A | 2/2000 | Takemura |
| 6,055,175 A | 4/2000 | Kang et al. |

(Continued)

FOREIGN PATENT DOCUMENTS

| CN | 101069062 A | 11/2007 |
| CN | 101278356 A | 10/2008 |

(Continued)

OTHER PUBLICATIONS

International Search Report re application No. PCT/JP2009065548, dated Nov. 17, 2009.

(Continued)

*Primary Examiner* — Harry W Byrne
(74) *Attorney, Agent, or Firm* — Husch Blackwell LLP

(57) ABSTRACT

A semiconductor device including a memory cell is provided. The memory cell comprises a transistor and a capacitor, and one of a resistor and a diode. A gate of the transistor is electrically connected to a word line, and one of a source and a drain of the transistor is electrically connected to a bit line. One terminal of the capacitor is electrically connected to the other of the source and the drain of the transistor, and the other terminal of the capacitor is electrically connected to a wiring. One terminal of one of the resistor and the diode is electrically connected to the other of the source and the drain of the transistor, and the other terminal of one of the resistor and the diode is electrically connected to the wiring.

10 Claims, 17 Drawing Sheets

(56) References Cited

U.S. PATENT DOCUMENTS

| | | |
|---|---|---|
| 6,496,407 B2 | 12/2002 | Ashikaga |
| 6,693,301 B2 | 2/2004 | Takemura |
| 6,759,680 B1 | 7/2004 | Takemura |
| 6,955,967 B2 * | 10/2005 | Chindalore et al. .......... 438/258 |
| 7,071,910 B1 | 7/2006 | Takemura |
| 7,082,073 B2 | 7/2006 | Casper |
| 7,116,302 B2 | 10/2006 | Takemura |
| 7,130,234 B2 | 10/2006 | Shionoiri et al. |
| 7,248,145 B2 | 7/2007 | Littlechild et al. |
| 7,253,440 B1 | 8/2007 | Takemura |
| 7,259,654 B2 | 8/2007 | Littlechild et al. |
| 7,319,633 B2 | 1/2008 | Shionoiri et al. |
| 7,408,828 B1 | 8/2008 | Casper |
| 7,414,517 B2 | 8/2008 | Littlechild et al. |
| 7,430,146 B2 | 9/2008 | Shionoiri et al. |
| 7,466,586 B2 | 12/2008 | Kim |
| 7,881,124 B2 | 2/2011 | Kari et al. |
| 7,995,415 B2 | 8/2011 | Casper |
| 8,159,332 B2 | 4/2012 | Littlechild et al. |
| 8,199,551 B2 * | 6/2012 | Matsuzaki ...................... 365/72 |
| 8,232,880 B2 * | 7/2012 | Yamazaki et al. ......... 340/572.7 |
| 8,319,609 B2 | 11/2012 | Littlechild et al. |
| 8,325,016 B2 | 12/2012 | Littlechild et al. |
| 2002/0005536 A1 * | 1/2002 | Schindler et al. ............. 257/296 |
| 2008/0094180 A1 | 4/2008 | Kato et al. |
| 2009/0079572 A1 | 3/2009 | Atsumi et al. |
| 2010/0181384 A1 | 7/2010 | Matsuzaki |

FOREIGN PATENT DOCUMENTS

| | | |
|---|---|---|
| EP | 0 513 532 B1 | 6/1997 |
| EP | 1 544 782 A2 | 6/2005 |
| EP | 1 544 788 A1 | 6/2005 |
| EP | 1 679 635 A1 | 7/2006 |
| EP | 1 837 797 A1 | 9/2007 |
| JP | 6-29488 | 2/1994 |
| JP | 6-310673 | 11/1994 |
| JP | 11-204608 | 7/1999 |
| JP | 2000-155303 A | 6/2000 |
| JP | 2003-526148 | 9/2003 |
| JP | 2008-123074 | 5/2008 |
| JP | 2008-141046 | 6/2008 |
| WO | WO 01/65712 A1 | 9/2001 |
| WO | WO 2006/060249 A1 | 6/2006 |

OTHER PUBLICATIONS

Written Opinion re application No. PCT/JP2009065548, dated Nov. 17, 2009.

Office Action re Chinese application No. CN 200980139973.0, dated Mar. 28, 2013 (with English translation).

* cited by examiner

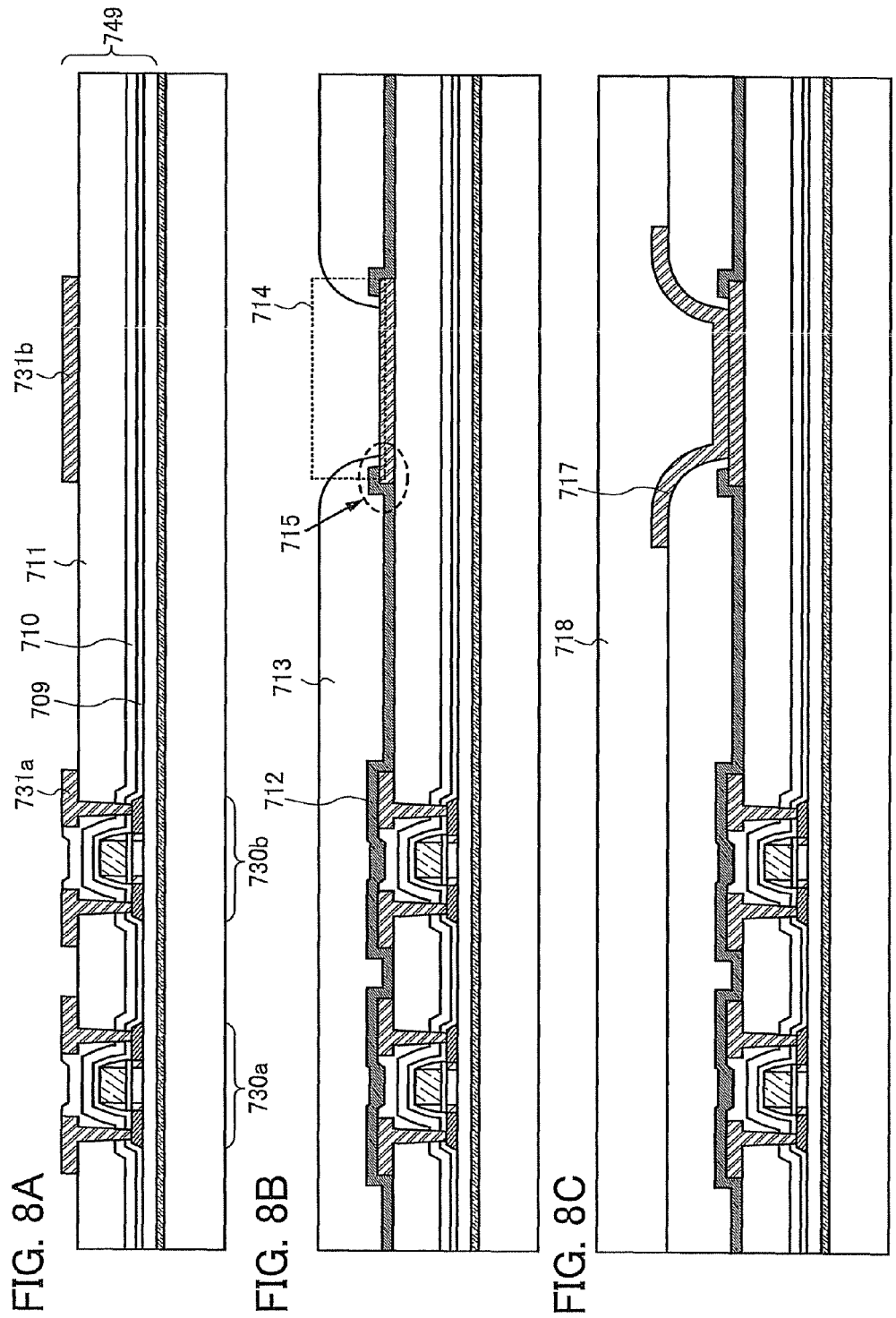

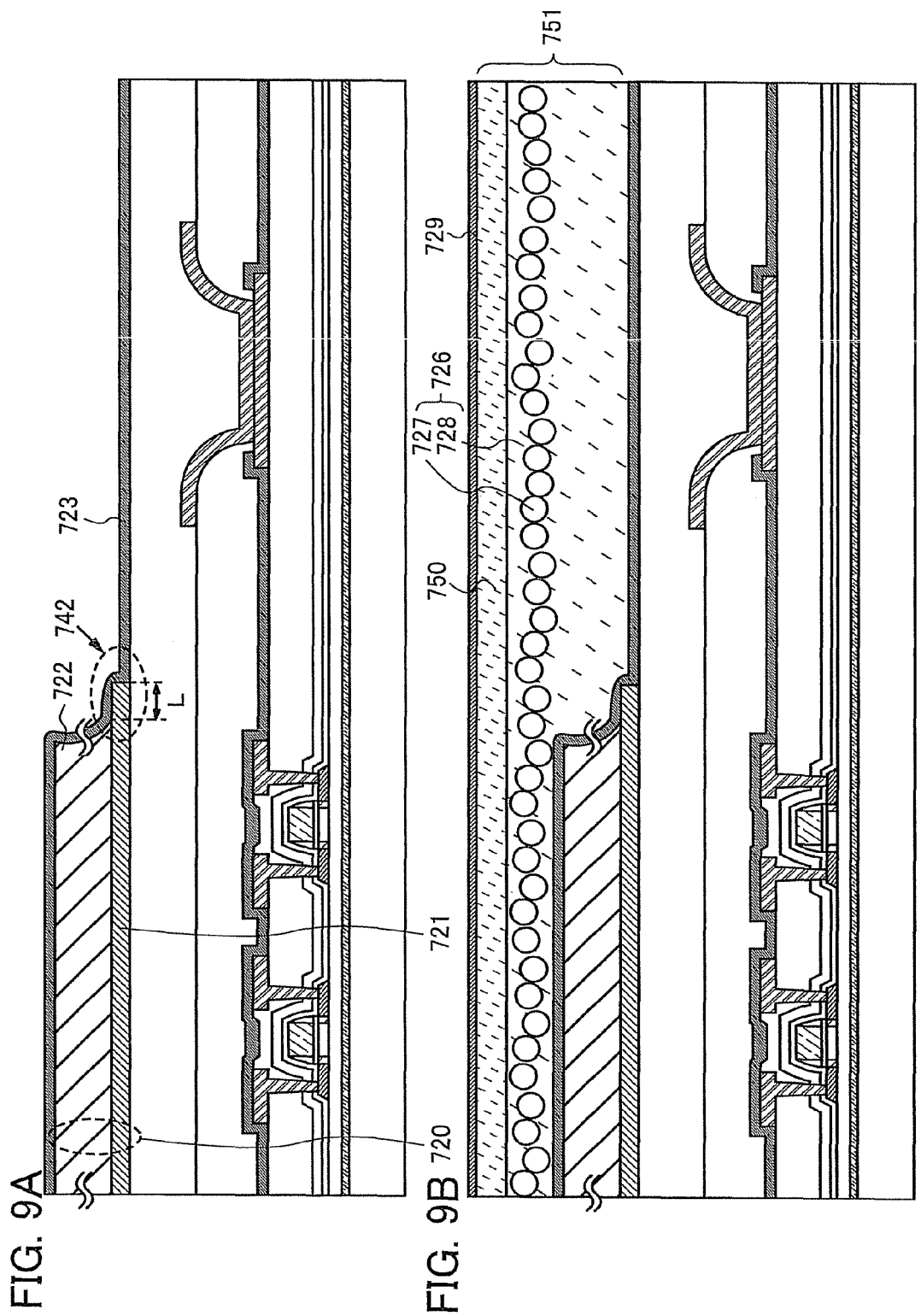

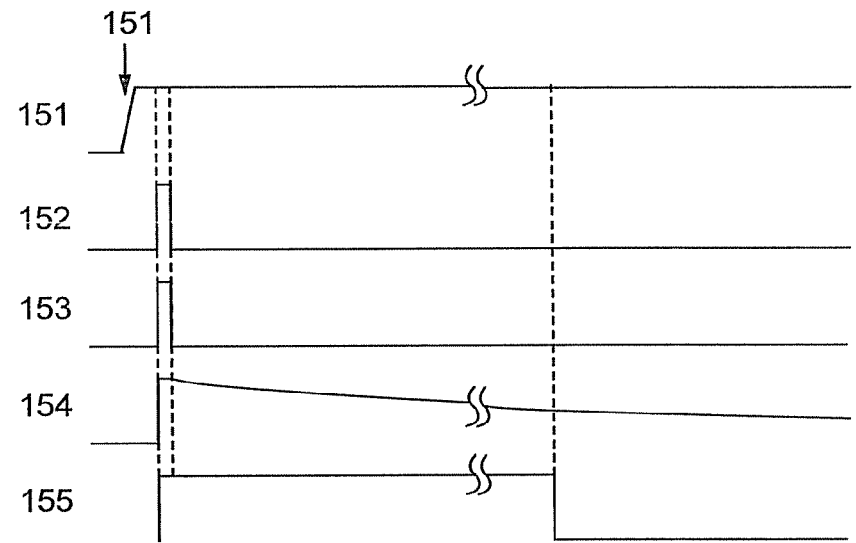
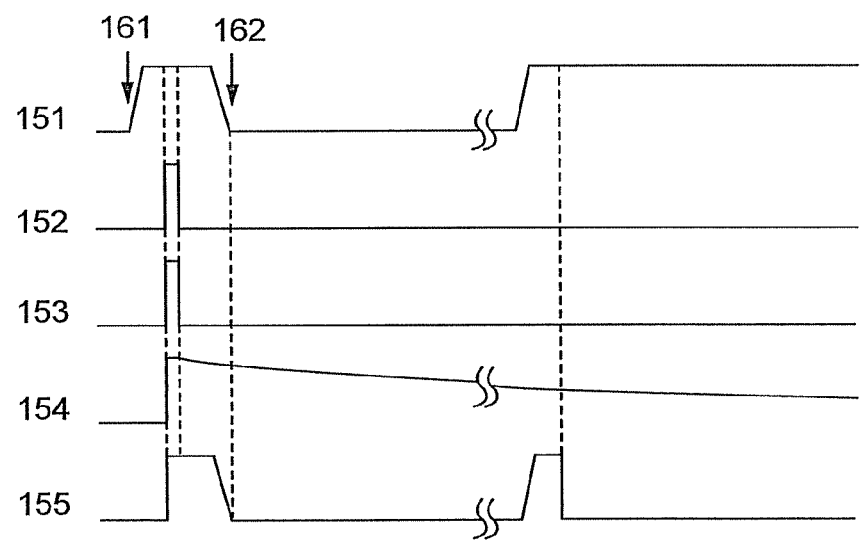

SEMICONDUCTOR DEVICE

This application is a continuation of application Ser. No. 12/570,619 filed on Sep. 30, 2009 now U.S. Pat. No. 8,199,551.

TECHNICAL FIELD

The present invention relates to a semiconductor device. In particular, the present invention relates to a semiconductor device including a memory circuit keeping data only during a predetermined time.

BACKGROUND ART

In recent years, an individual identification technology using wireless communication (hereinafter, referred to as a wireless communication system) has attracted attention. In particular, as a data carrier which transmits/receives data by wireless communication, an individual identification technology with a wireless tag utilizing an RFD (radio frequency identification) technology (hereinafter, referred to as a wireless tag regardless of its shape such as a card shape or a chip shape) has attracted attention. A wireless tag is also referred to as an IC tag, an RFID tag, or an electronic tag.

In the field of manufacture and distribution, an individual identification technology with a wireless tag has started to be utilized for management of a large number of items and the like instead of conventional management with a bar code, and has been developed to be applied for individual identification.

Here, a wireless communication system refers to a communication system in which data is transmitted/received wirelessly between a transmitter receiver (also referred to as an interrogator), such as a reader/writer (hereinafter, referred to as a R/W), and a wireless tag. In such a wireless communication system, data which is to be transmitted and received is superposed on carrier waves emitted from the R/W, so that communication is performed.

As one function for improving reading accuracy and preventing collision, a wireless tag is equipped with a session flag. A session flag prevents additional readout of ID from the wireless tag from which the ID has been read out. For example, the session flag has two kinds of data of A and B and the wireless tag from which ID is read out is set from A to B.

The session flag has a persistence time regardless of electricity supplied from the R/W to the wireless tag. For example, when the session flag is once set to B, the session flag is set to B during a period shorter than the persistence time. The session flag is set to A during a period longer than the persistence time. A memory is needed for realizing the persistence time.

Memories used practically can be roughly classified into volatile memories and nonvolatile memories. Nonvolatile memories keep stored data regardless of presence or absence of supply of a power supply voltage. Volatile memories cannot keep stored data without supply of a power supply voltage.

As an example of volatile memories, DRAMs are given. FIG. 4 is a circuit diagram showing a structural example of a DRAM cell.

A memory cell 406 in FIG. 4 includes an n-channel transistor 401 and a capacitor 402. A gate of the n-channel transistor 401 is connected to a word line 405. One of a drain and a source of the n-channel transistor 401 is connected to the capacitor 402 and the other of the drain and the source of the n-channel transistor is connected to a bit line 404. A terminal of the capacitor 402 which is not connected to the n-channel transistor 401 is connected to a reference potential 403. Note that "connection" means "electrical connection" in this specification.

The n-channel transistor 401 is operated by the word line 405 at the time of writing and readout of data and is on at the time of the writing and readout of data. In addition, at the time other than the time of the writing and readout of data, the n-channel transistor 401 is off. Presence or absence of electric charge in the capacitor 402, that is, a high voltage and a low voltage of a terminal voltage of the capacitor 402 correspond to binary data "1" and binary data "0", respectively. Note that, in this specification, the high voltage refers to a voltage higher than the reference potential and the low voltage refer to a potential equal to the reference potential.

A voltage corresponding to the data "1" or the data "0" is applied from the bit line 404 to the capacitor 402 through the n-channel transistor 401, so that electricity is charged and discharged, and operation of writing is performed. Operation of readout is performed by detecting presence and absence of electric charge in the capacitor 402 and a high voltage and a low voltage. Electric charge kept in the capacitor 402 is output to the bit line, so that readout is performed. A sense amplifier which is not illustrated amplifies a minute change of the bit line 404, whereby the readout is performed.

Electric charge is accumulated in the capacitor 402, so that stored data is kept. However, leak of the electric charge kept in the capacitor 402 occurs due to various causes, so that a sufficient amount of the electric charge given in the capacitor 402 is to disappear eventually. That is, the stored data is crashed. A leakage current of the n-channel transistor 401 is a main cause of the leakage.

The data is read out before the electric charge disappears completely, and writing to the memory cell is performed again based on the data which is read out. If this cycle is repeated, the stored data can be kept for a long time. This operation is referred to as refresh operation.

In a circuit structure similar to that of the DRAM cell, if refresh operation is not performed, a period during which data can be kept is determined depending on the amount of electric charge in the capacitor and the leakage current of the transistor (e.g., see Patent Document 1).

REFERENCE

[Patent Document 1] Japanese Published Patent Application No. H06-029488.

DISCLOSURE OF INVENTION

Since a leakage current of a transistor is significantly influenced by characteristics of the transistor depending on a process, periods during which data can be kept vary significantly among transistors. One object of an embodiment of the present invention is to provide a semiconductor device in which variation in the period during which data can be kept regardless of characteristics of transistors is redressed.

An additional current path is provided against the leakage current of the transistor. The amount of current flowing through the additional path is set so as to be larger than the amount of the leakage current of the transistor, so that variation in the periods during which data can be kept regardless of the characteristics of the transistors is redressed.

In the present invention, in order that the leakage current does not flow to the transistor, an element is added in parallel to the capacitor and the additional current path is provided.

A semiconductor according to an embodiment of the present invention includes an antenna circuit which transmits/ receives signals wirelessly, and a memory circuit in which data based on the signals is kept. The memory circuit includes a transistor, a capacitor, and a resistor. One of a source and a drain of the transistor is electrically connected to one terminal of the capacitor. Further, the one terminal of the capacitor is electrically connected to one terminal of the resistor. The other terminal of the capacitor is supplied with a constant potential. The other terminal of the resistor is supplied with a constant potential.

A semiconductor device according to an embodiment of the present invention includes an antenna circuit which transmits/receives signals wirelessly and a memory circuit in which data based on the signals are kept. The memory circuit includes a transistor, a capacitor, and a resistor. One of a source and a drain of the transistor is electrically connected to one terminal of the capacitor. Further, the one terminal of the capacitor is electrically connected to one terminal of the resistor. The other terminal of the capacitor is supplied with a constant potential. The other terminal of the resistor is supplied with a constant potential. In such a semiconductor device, when a voltage equal to the potential supplied to the other terminal of the capacitor is applied to the other of the source and the drain of the transistor and a gate of the transistor, the amount of electric charge which is kept in the capacitor and then flows to the resistor is larger than the amount of electric charge which kept in the capacitor and then flows to the transistor.

A semiconductor device according to an embodiment of the present invention includes an antenna circuit which transmits/receives signals wirelessly, and a memory circuit in which data based on the signals is kept. The memory circuit includes a transistor, a capacitor, and a diode. One of a source and a drain of the transistor is electrically connected to one terminal of the capacitor. Further, the one terminal of the capacitor is electrically connected to one terminal of the diode. The other terminal of the capacitor is supplied with a constant potential. The other terminal of the diode is supplied with a constant potential.

A semiconductor device according to an embodiment of the present invention includes an antenna circuit which transmits/receives signals wirelessly, and a memory circuit in which data based on the signals is kept. The memory circuit includes a transistor, a capacitor, and a diode. One of a source and a drain of the transistor is electrically connected to one terminal of the capacitor. Further, the one terminal of the capacitor is electrically connected to one terminal of the diode. The other terminal of the capacitor is supplied with a constant potential. The other terminal of the diode is supplied with a constant potential. In such a semiconductor device, when a voltage equal to the potential supplied to the other terminal of the capacitor is applied to the other of the source and the drain of the transistor and a gate of the transistor, the amount of electric charge which is kept in the capacitor and then flows to the diode is larger than the amount of electric charge which kept in the capacitor and then flows to the transistor.

A semiconductor device according to an embodiment of the present invention includes an antenna circuit which transmits/receives signals wirelessly, and a memory circuit in which data based on the signals is kept. The memory circuit includes a transistor, a capacitor, and a diode-connected transistor. One of a source and a drain of the transistor is electrically connected to one terminal of the capacitor. Further, the one terminal of the capacitor is electrically connected to one terminal of the diode-connected transistor. The other terminal of the capacitor is supplied with a constant potential. The other terminal of the diode-connected transistor is supplied with a constant potential.

A semiconductor device according to an embodiment of the present invention includes an antenna circuit which transmits/receives signals wirelessly, and a memory circuit in which data based on the signals is kept. The memory circuit includes a transistor, a capacitor, and a diode-connected transistor. One of a source and a drain of the transistor is electrically connected to one terminal of the capacitor. Further, the one terminal of the capacitor is electrically connected to one terminal of the diode-connected transistor. The other terminal of the capacitor is supplied with a constant potential. The other terminal of the diode-connected transistor is supplied with a constant potential. In such a semiconductor device, when a voltage equal to the potential supplied to the other terminal of the capacitor is applied to the other of the source and the drain of the transistor and a gate of the transistor, the amount of electric charge which is kept in the capacitor and then flows to the diode-connected transistor is larger than the amount of electric charge which kept in the capacitor and then flows to the transistor.

Note that a plurality of the diodes may be electrically connected to each other in series.

In addition, the memory circuit further includes a buffer circuit. The buffer circuit may be electrically connected to the one of the source and the drain of the transistor.

According to an embodiment of the present invention, the additional current path which is different from the leakage current path of the transistor is provided, so that electric charge kept in the capacitor flows not to the leakage current path of the transistor but to the additional current path. An additional path of a linear element or an element which has less variation in the characteristics than the transistor is provided in addition to the path of the transistor that is a non-linear element, so that electric charge kept in the capacitor can be discharged to the additional path selectively. Accordingly, when the path of the linear element or the element which has less variation in characteristics than the transistor is used, the amount of discharge of electricity in each capacitor in the memory circuit can be uniformed. Therefore, the discharge time of each capacitor is uniformed, variation in the periods during which data can be kept can be reduced.

BRIEF DESCRIPTION OF DRAWINGS

FIGS. 8A to 8C are cross-sectional views illustrating a method for manufacturing a semiconductor device.

FIGS. 9A and 9B are cross-sectional views illustrating a method for manufacturing a semiconductor device.

FIGS. 15A and 15B are timing charts of an operation example of the present invention.

BEST MODE FOR CARRYING OUT THE INVENTION

Figure 1:
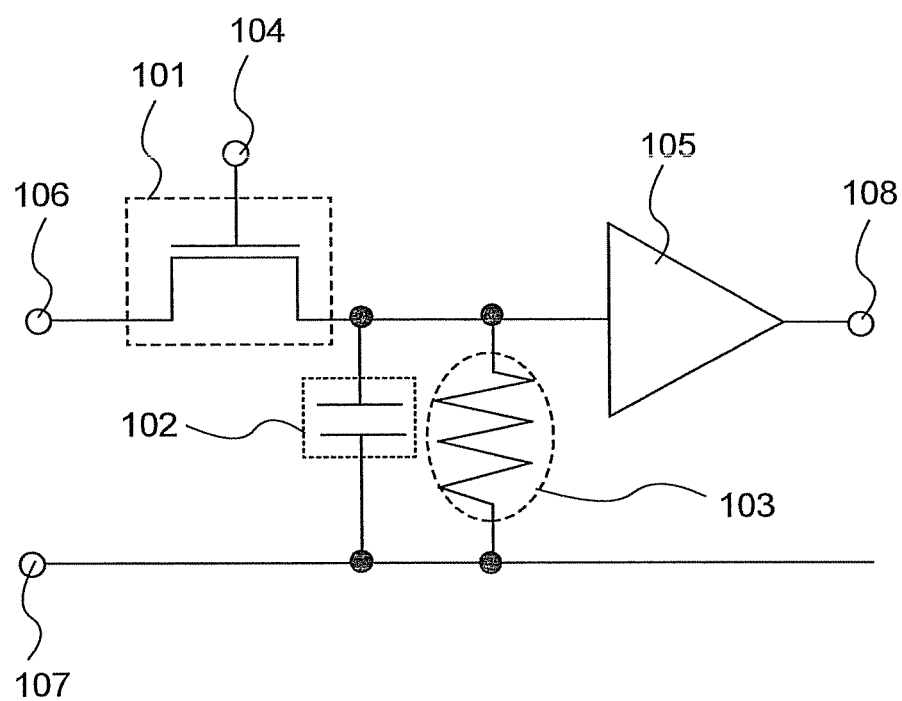
FIG. 1 is a diagram showing an embodiment of the present invention.

Embodiments of the present invention are described with reference to the drawings. However, the present invention can be carried out in many different modes, and it will be easily understood by those skilled in the art that various changes and modifications can be made to the modes and their details without departing from the spirit and scope of the present invention. Therefore, the present invention should not be interpreted as being limited to what is described in the embodiments described below. Note that a reference numeral denoting the same portion in all figures is used in common in the structure of the present invention which is described below.

[Embodiment 1]

FIG. 1 illustrates a memory circuit included in a semiconductor device of an embodiment of the present invention. The memory circuit is provided with a plurality of memory cells. FIG. 1 is a circuit diagram of one memory cell and a buffer. The memory cell includes an NMOS 101, a capacitor 102, and a resistor 103. A buffer 105 may be provided in each group which includes a plurality of memory cells; alternatively, the buffer 105 may be provided in each memory cell. A terminal 104 selects data at the time of writing and is electrically connected to a word line. A terminal 106 inputs a voltage corresponding to data "1" or data "0" and is electrically connected to a bit line. A terminal 108 outputs the data written. A terminal 107 is a terminal to which a reference voltage is applied, and is electrically connected to a wiring. One of a source and a drain of the n-channel transistor (hereinafter, referred to as the "NMOS") 101 is connected to the terminal 106. The other of the source and the drain of the NMOS 101 is connected to a terminal of the capacitor 102, a terminal of the resistor 103, and the buffer 105. The terminal 104 is connected to a gate of the NMOS 101. The terminal 108 is connected to an output of the buffer 105. The terminal 107 is connected to a terminal of the capacitor, which is not connected to the other of the source or drain of the NMOS 101, and a terminal of the resistor 103, which is not connected to the other of the source and drain of the NMOS 101.

Here, the data "1" represents a high voltage and the data "0" represents a low voltage.

Next, operation thereof is described. First, when the data "0" is written in the case where a power supply voltage is supplied, a voltage of the capacitor 102 is low and electric charge is not accumulated. Therefore, the data "0" does not change to the data "1" over time.

Next, when the data "1" is written in the case where a power supply voltage is supplied, a high voltage is applied to the terminal 106 and the drain of the NMOS 101. A high voltage is, also applied to the terminal 104 and the gate of the NMOS 101, and therefore, the NMOS 101 is turned on. Thus, current flows to the capacitor 102, electric charge is accumulated, and a voltage is generated. When the voltage of the capacitor 102 is high, the output of the buffer 105 has a high voltage. Then, the data "1" is output to the terminal 108 and writing is terminated.

After termination of the wiring of the data "1", in the case where the data "1" is to be kept, a low voltage is applied to the terminal 104 and the gate of the NMOS 101, and therefore, the NMOS 101 is turned off. The amount of current flowing to the resistor 103 is set to be larger than the amount of the leakage current of the NMOS 101; therefore, the electric charge of the capacitor 102 flows via the resistor 103 which is an additional current path. Accordingly, the amount of the electric charge of the capacitor 102 is reduced and the voltage of the capacitor 102 is lowered. When the voltage of the capacitor 102, that is, the input voltage of the buffer 105 is lower than the inverting voltage of the buffer 105, the output of the buffer 105 has a low voltage, the data "0" is output to the terminal 108, and the data "1" is changed to the data "0". Keeping of the data "1" is terminated. Therefore, by the resistance value of the resistor 103, the time during which the data "1" is changed to the data "0" can be kept equal to a predetermined time which is determined by the discharge time of the capacitor.

After termination of the writing of the data "1", in the case where the data "1" is kept or supply of the power supply voltage is temporarily stopped, a low voltage is applied to the gate of the NMOS 101 and the NMOS 101 is turned off. The amount of current flowing to the resistor 103 is set to be larger than the amount of the leakage current of the NMOS 101; therefore, the electric charge of the capacitor 102 flows via the resistor 103 which is the additional current path. Accordingly, the amount of the electric charge in the capacitor 102 is reduced and the voltage of the capacitor is lowered. When the voltage of the capacitor 102 is higher than the inverting voltage of the buffer 105 in the case where a power supply voltage is supplied again, the data "1" is output to the terminal 108 and therefore, the data is kept. However, when the voltage of the capacitor 102 is lower than the inverting voltage of the buffer 105 in the case where a power supply voltage is supplied again, the output of the buffer 105 has a low voltage and the data "0" is output to the terminal 108. In other words, regardless of presence or absence of supply of a power supply voltage, the period during which the data "1" is changed to the data "0" can be kept equal to a predetermined time determined by the discharge time of the capacitor.

In the case where the power supply voltage is not supplied, the data "0" and the data "1" cannot be written. Therefore, the data is not rewritten.

As the NMOS 101, either an n-channel thin film transistor or a p-channel thin film transistor can be used. In the case of a p-channel thin film transistor, the levels of the voltages which are input to the terminal 104 are reversed.

[Embodiment 2]

Figure 2:
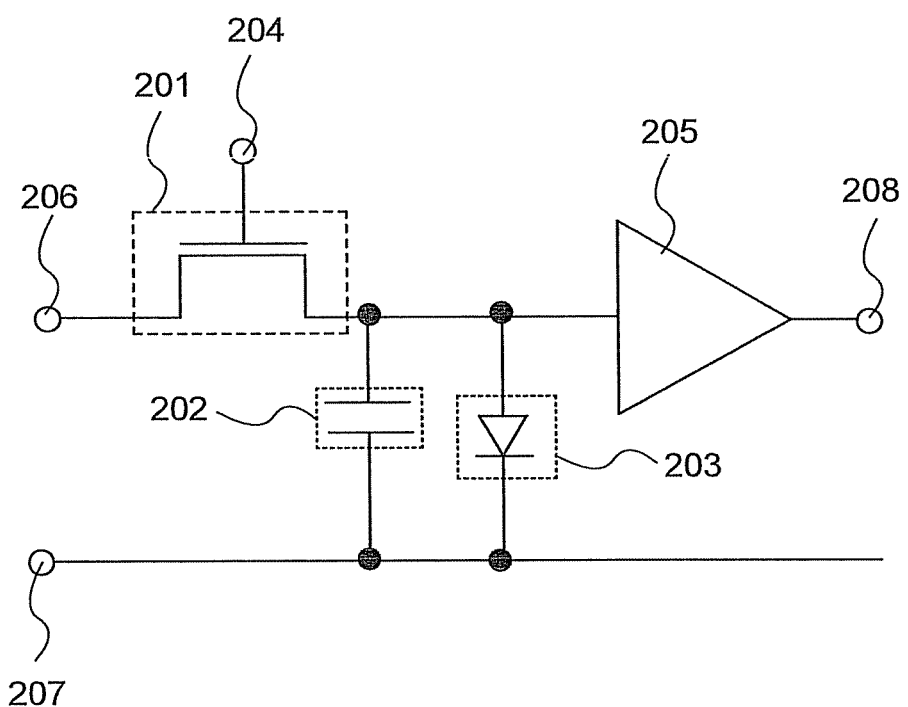
FIG. 2 is a diagram showing an embodiment of the present invention.

FIG. 2 illustrates a memory circuit included in a semiconductor device of an embodiment of the present invention. The memory circuit is provided with a plurality of memory cells. FIG. 2 is a circuit diagram of one memory cell and a buffer. The memory cell includes an NMOS 201, a capacitor 202, and a diode 203. A buffer 205 may be provided in each group which includes a plurality of memory cells; alternatively, the buffer 205 may be provided in each memory cell. A terminal 204 selects data at the time of writing and is electrically connected to a word line. A terminal 206 inputs a voltage corresponding to data "1" or data "0" and is electrically connected to a bit line. A terminal 208 outputs the data written. A terminal 207 is a terminal to which a reference voltage is applied, and is electrically connected to a wiring. One of a source and a drain of the n-channel transistor (hereinafter, referred to as the "NMOS") 201 is connected to the terminal 206. The other of the source and drain of the NMOS 201 is connected to a terminal of the capacitor 202, an anode of the diode 203, and the buffer 205. The terminal 204 is connected to a gate of the NMOS 201. The terminal 208 is connected to an output of the buffer 205. The terminal 207 is connected to a terminal of the capacitor 202, which is not connected to the other of the source and the drain of the NMOS 201. In addition, the terminal 207 is connected to a cathode of the diode 203.

A plurality of the diodes 203 may be connected to each other in series.

As the diode 203, either a diode-connected transistor or a PIN-junction diode may be used.

Figure 3:
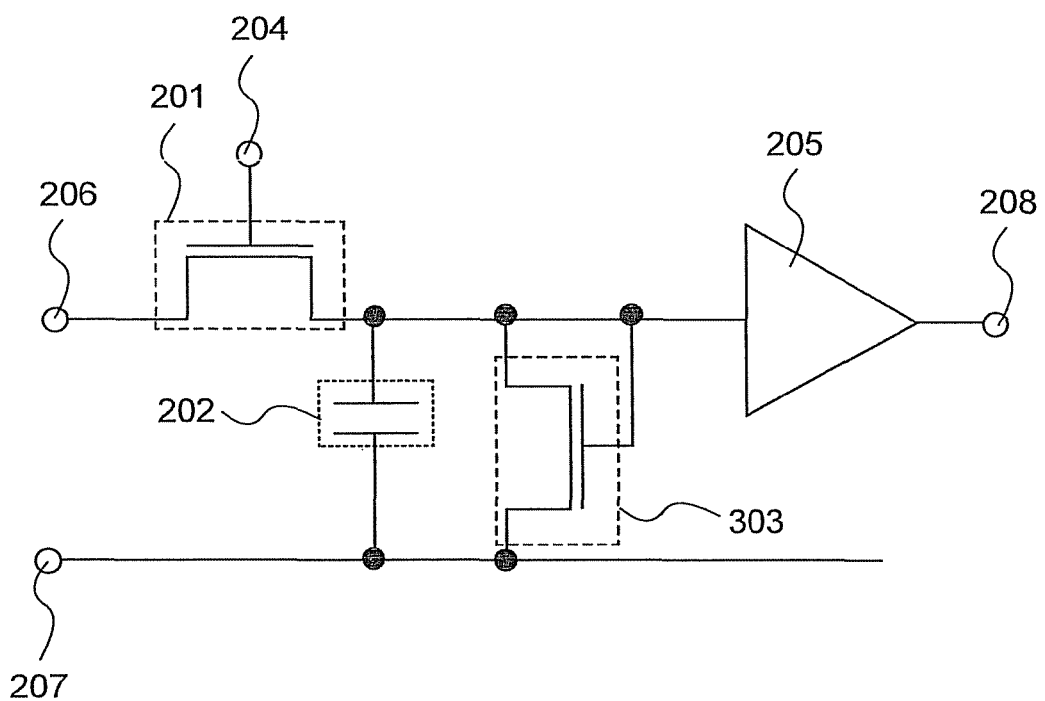
FIG. 3 is a diagram showing an embodiment of the present invention.
Figure 4:
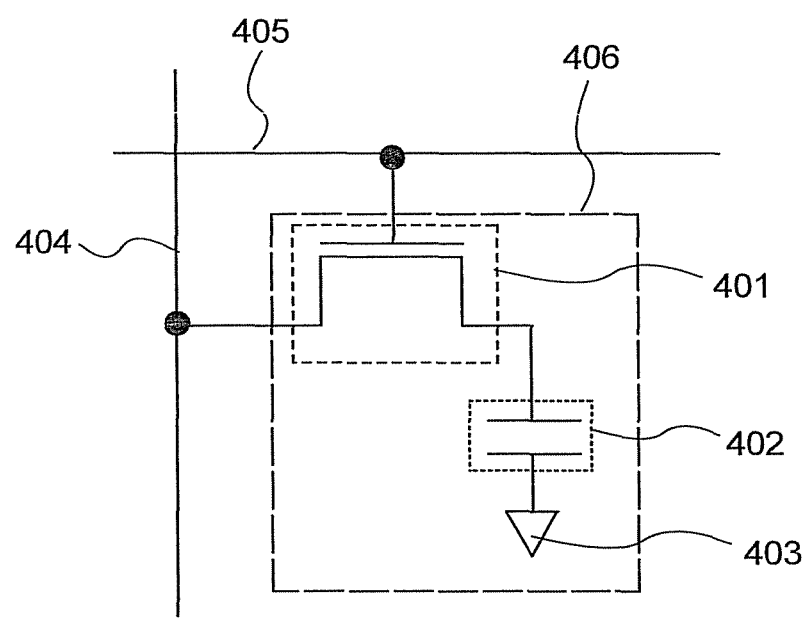
FIG. 4 is a diagram showing a DRAM cell for general purpose use.

FIG. 3 is a circuit diagram of a memory circuit included in a semiconductor device of the present invention, in which a diode-connected transistor 303 is used in place of the diode 203.

Here, the data "1" represents a high voltage and the data "0" represents a low voltage.

Next, operation in FIG. 2 is described. First, when the data "0" is written in the case where a power supply voltage is supplied, a voltage of the capacitor 202 is low and electric charge is not accumulated. Therefore, the data "0" does not change to the data "1" over time.

Next, when the data "1" is written in the case where the power supply voltage is supplied, a high voltage is applied to the terminal 206 and the drain of the NMOS 201. A high voltage is also applied to the terminal 204 and the gate of the NIVIOS 201, and therefore, the NMOS 201 is turned on. Thus, current flows to the capacitor 202, electric charge is accumulated, and a voltage is generated. When the voltage of the capacitor 202 is high, the output of the buffer 205 has a high voltage. Then, the data "1" is output to the terminal 208 and writing is terminated.

After termination of the writing of the data "1", in the case where the data "1" is kept, a low voltage is applied to the terminal 204 and the gate of the NMOS 201, and therefore, the NMOS 201 is turned off. The amount of current flowing to the diode 203 is set to be larger than the amount of the leakage current of the NMOS 201; therefore, the electric charge of the capacitor 202 flows via the diode 203 which is an additional current path. Accordingly, the amount of the electric charge in the capacitor 202 is reduced and the voltage of the capacitor 202 is lowered. When the voltage of the capacitor 202, that is, the input voltage of the buffer 205 is lower than the inverting voltage of the buffer 205, the output of the buffer 105 has a low voltage, the data "0" is output to the terminal 208, and the data "1" is changed to the data "0". Keeping of the data "1" is terminated. Therefore, by the amount of the current flowing to the diode 203, the time during which the data "1" is changed to the data "0" can be kept equal to a predetermined time which is determined by the discharge time of the capacitor.

After termination of the writing of the data "1", in the case where the data "1" is kept or supply of the power supply voltage is temporarily stopped, a low voltage is applied to the gate of the NMOS 201, and therefore, the NMOS 201 is turned off. The amount of current flowing to the diode 203 is set to be larger than the amount of the leakage current of the NMOS 201; therefore, the electric charge of the capacitor 202 flows via the diode 203 which is the additional current path. Accordingly, the amount of the electric charge of the capacitor 202 is reduced and the voltage of the capacitor 202 is lowered. When the voltage of the capacitor 202 is higher than the inverting voltage of the buffer 205 in the case where a power supply voltage is supplied again, the data "1" is output to the terminal 208, and therefore, the data is kept. However, when the voltage of the capacitor 202 is lower than the inverting voltage of the buffer 205 in the case where a power supply voltage is supplied again, the output of the buffer 205 has a low voltage and the data "0" is output to the terminal 208. In other words, regardless of presence or absence of supply of a power supply voltage, the period during which the data "1" is changed to the data "0" can be kept equal to a predetermined time determined by the discharge time of the capacitor.

In the case where the power supply voltage is not supplied, the data "0" and the data "1" cannot be written. Therefore, the data is not rewritten.

As the NMOS 201, either of an n-channel thin film transistor and a p-channel thin film transistor can be used. In the case of a p-channel thin film transistor, the levels of the voltages which are input to the terminal 204 are reversed.

In addition, as the diode-connected transistor 303 in FIG. 3, either a p-channel thin film transistor or an n-channel thin film transistor can be used. In the case of an n-channel thin film transistor, the diode-connected transistor 303 is connected as illustrated in FIG. 3. Alternatively, in the case of a p-channel thin film transistor, a gate of the diode-connected transistor 303 is connected to the terminal 207 in FIG. 3.

[Embodiment 3]

In this embodiment, a structure of an RFID tag for which a semiconductor device described in the above embodiment is used is described with reference to drawings.

Figure 5:
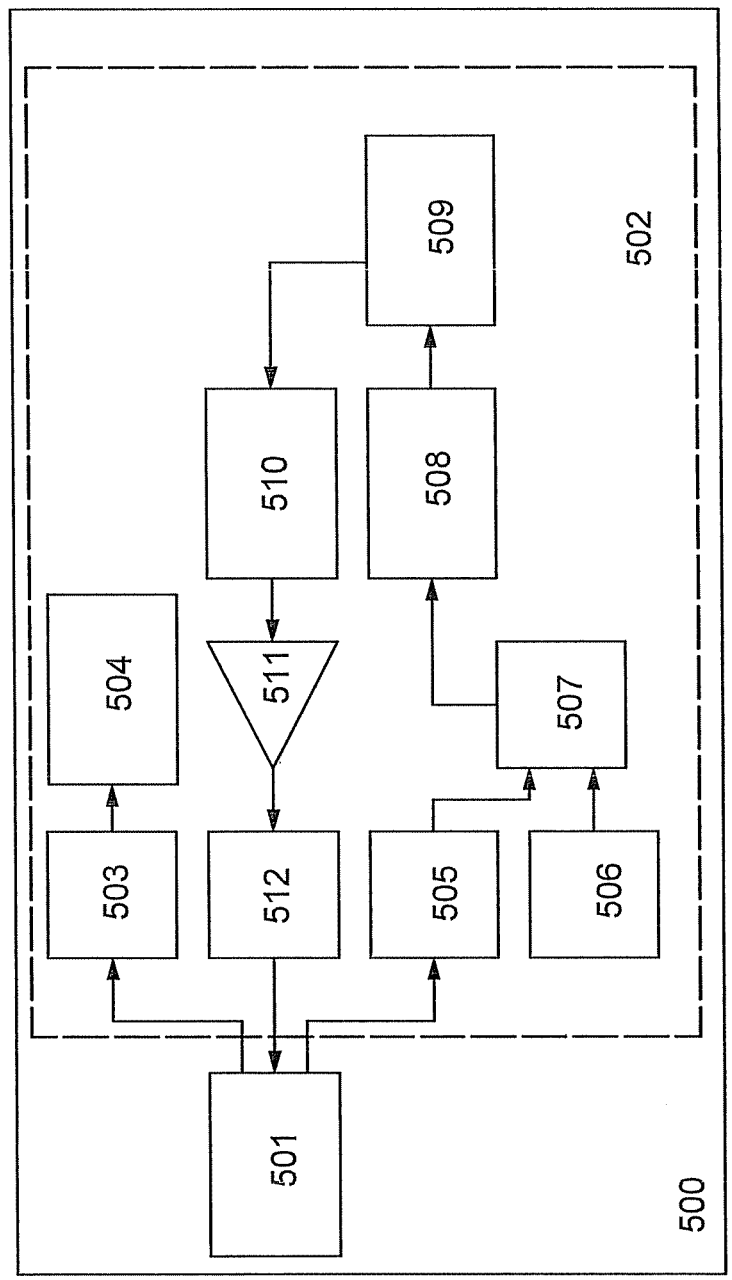
FIG. 5 is a diagram showing a structure of a semiconductor device.

A block diagram of the RFID tag of this embodiment is shown in FIG. 5.

An RFID tag 500 in FIG. 5 includes an antenna circuit 501 and a signal processing circuit 502. The signal processing circuit 502 includes a rectifier circuit 503, a power supply circuit 504, a demodulation circuit 505, an oscillator circuit 506, a logic circuit 507, a memory control circuit 508, a memory circuit 509, a logic circuit 510, an amplifier 511, and a modulation circuit 512.

Communication signals received by the antenna circuit 501 of the RFID tag 500 are input into the demodulation circuit 505 of the signal processing circuit 502. The frequency of the communication signals received, that is, signals transmitted/received between the antenna circuit 501 and a R/W can be, for example, UHF (ultra high frequency) bands including 915 MHz, 2.45 GHz, and the like that are determined based on the ISO standards or the like. Needless to say, the frequency of signals transmitted/received between the antenna circuit 501 and the R/W is not limited thereto, and for example, any of the following frequencies can be used: submillimeter waves of 300 GHz to 3 THz, millimeter waves of 30 GHz to 300 GHz, microwaves of 3 GHz to 30 GHz, an ultra high frequency of 300 MHz to 3 GHz, and a very high frequency of 30 MHz to 300 MHz. The signals transmitted/received between the antenna circuit 501 and the R/W are signals whose carrier waves are modulated. A modulation method of carrier waves may be either analog modulation or digital modulation, or may be any of amplitude modulation, phase modulation, frequency modulation, and spread spectrum. Preferably, amplitude modulation or frequency modulation is adopted.

An oscillation signal output from the oscillator circuit 506 is supplied as a clock signal to the logic circuit 507. In addition, the carrier waves that have been modulated are demodulated in the demodulation circuit 505. The demodulated signals are transmitted to the logic circuit 507 and analyzed. The signals analyzed by the logic circuit 507 are transmitted to the memory control circuit 508. Then, based on the signal, the memory control circuit 508 controls the memory circuit 509 and takes data stored in the memory circuit 509 to transmit the data to the logic circuit 510. The signal transmitted to the logic circuit 510 is encoded in the logic circuit 510 and amplified in the amplifier 511. With the amplified signal, the modulation circuit 512 modulates carrier waves. With the modulated carrier waves, the R/W recognizes the signals from the RFID tag. On the other hand, carrier waves input to the rectifier circuit 503 are rectified and then input to the power supply circuit 504. A power supply voltage obtained in this manner is supplied by the power supply circuit 504 to the demodulation circuit 505, the oscillator circuit 506, the logic circuit 507, the memory control circuit 508, the memory circuit 509, the logic circuit 510, the amplifier 511, the modulation circuit 512, and the like. Note that the power supply circuit 504 is not necessarily provided; however, here, the power supply circuit 504 has a function of stepping down or stepping up an input voltage or inverting the polarity of the input voltage. The RFID tag 500 operates in this manner.

Note that a connection between the signal processing circuit and the antenna in the antenna circuit is not specifically limited. For example, the antenna and the signal processing circuit may be connected by wire bonding or bump connection. Alternatively, the signal processing circuit may be formed to have a chip shape and one surface thereof may be used as an electrode to be attached to the antenna. In addition, the signal processing circuit and the antenna can be attached to each other by use of an ACF (anisotropic conductive film).

Note that the antenna may be either stacked over the same substrate as the signal processing circuit 502, or fowled as an external antenna. Needless to say, the antenna may also be provided on the top or bottom of the signal processing circuit.

The rectifier circuit 503 may be any circuit as long as it converts AC signals that are induced by carrier waves received by the antenna circuit 501 into DC signals.

Figure 6:
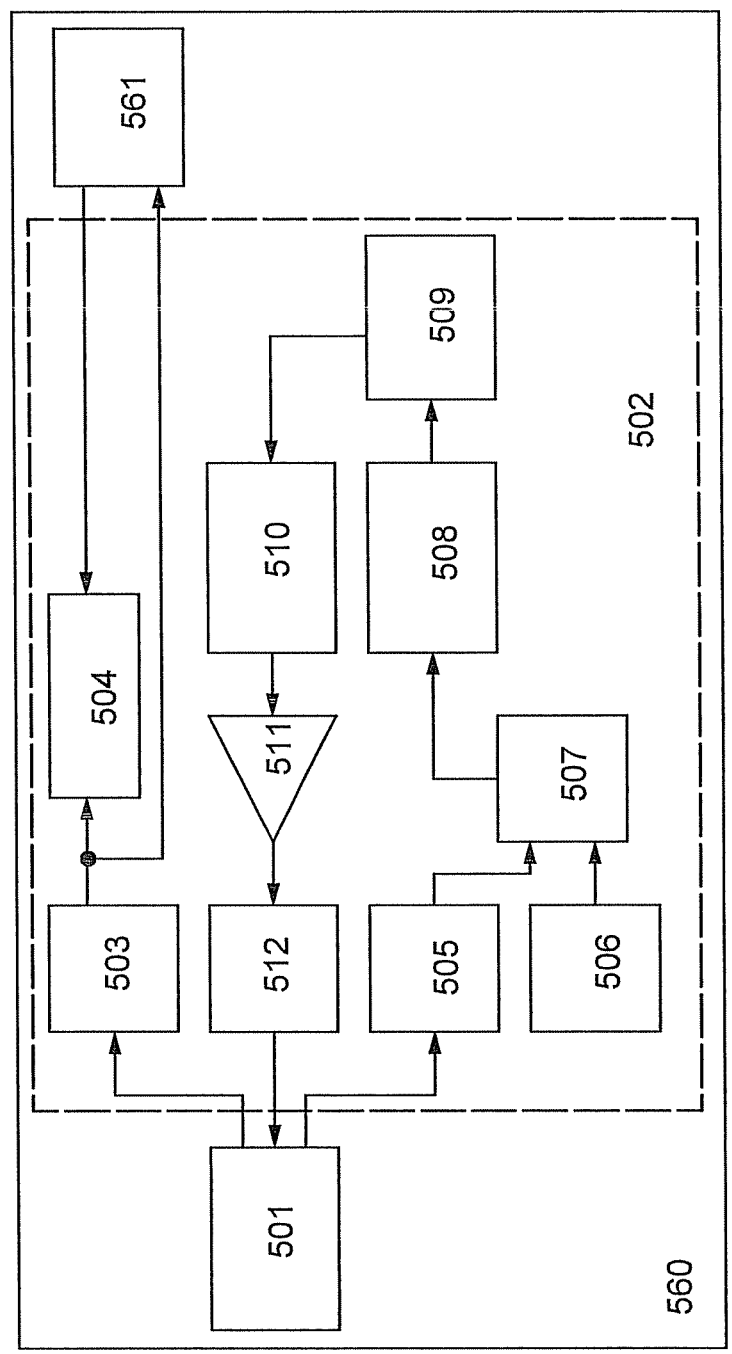
FIG. 6 is a diagram showing a structure of a semiconductor device.

Note that the RFID tag described in this embodiment may be provided with a battery 561 as shown in FIG. 6, in addition to the structure shown in FIG. 5. When a power supply voltage output from the rectifier circuit 503 is not high enough to operate the signal processing circuit 502, the battery 561 can also supply a power supply voltage to each circuit of the signal processing circuit 502, such as the demodulation circuit 505, the oscillator circuit 506, the logic circuit 507, the memory control circuit 508, the memory circuit 509, the logic circuit 510, the amplifier 511, and the modulation circuit 512. Concerning energy to be stored in the battery 561, a surplus voltage of the power supply voltage output from the rectifier circuit 503 may be stored in the battery 561, for example, when the power supply voltage output from the rectifier circuit 503 is sufficiently higher than the power supply voltage required to operate the signal processing circuit 502. It is also possible to provide another set of an antenna circuit and a rectifier circuit in the RFID tag, in addition to the antenna circuit 501 and the rectifier circuit 503 so that the battery 561 can be charged with energy obtained from electromagnetic waves and the like that are generated randomly.

Note that "battery" means a battery whose continuous use time can be restored by charging. Note that, as the battery 561, a battery formed in a sheet-like form is preferably used. For example, by using a lithium polymer battery in which a gel electrolyte is used, a lithium ion battery, a lithium secondary battery, or the like, reduction in size is possible. Needless to say, any battery may be used as long as it is chargeable. For example, a nickel metal hydride battery, a nickel cadmium battery, a high-capacity capacitor, or the like may be used.

This embodiment can employ the structure of the semiconductor device described in any of other embodiments in this specification.

In addition, each of the circuits used in FIG. 1, FIG. 2, and FIG. 3 can also be use as a delay circuit of signals by keeping the signals for a predetermined period in FIG. 5 or FIG. 6.

For example, each of the circuits used in FIG. 1, FIG. 2, and FIG. 3 can be used for delaying the signals in the any of the following cases: in the case where the circuit is connected between the logic circuit 507 and the memory control circuit 508; in the case where the circuit is connected between the memory control circuit 508 and the memory circuit 509; in the case where the circuit is connected between the memory circuit 509 and the logic circuit 510.

[Embodiment 4]

In this embodiment, an example of a method for manufacturing a semiconductor device described in the above embodiment is described.

Figure 7A:
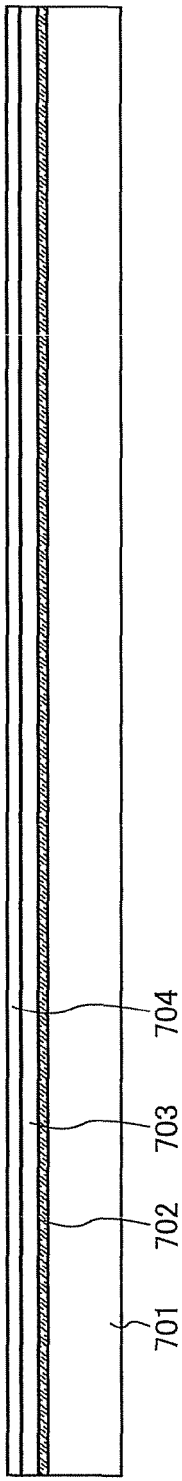
FIGS. 7A to 7C are cross-sectional views illustrating a method for manufacturing a semiconductor device.

First, a separation layer 702 is formed over a surface of a substrate 701, and an insulating film 703 functioning as a base and a semiconductor film 704 (e.g., a film including amorphous silicon) are formed (see FIG. 7A). The separation layer 702, the insulating film 703, and the semiconductor film 704 can be formed successively, which can prevent impurities from entering because the films are not exposed to the atmosphere.

As the substrate 701, a glass substrate, a quartz substrate, a metal substrate, a stainless steel substrate, a plastic substrate having heat resistance to the processing temperature of this process, or the like may be used. Such a substrate is not particularly limited in area or shape. For example, by using a rectangular substrate with a side of 1 meter or longer, productivity can be significantly increased. This is a great advantage as compared to the case of using a circular silicon substrate. Even when a circuit portion occupies a larger area, production cost can be reduced as compared to the case of using the silicon substrate.

Note that the separation layer 702 is formed over the entire surface of the substrate 701 in this process; however, a separation layer may be formed over the entire surface of the substrate 701 and then selectively provided by a photolithography method as needed to form the separation layer 702. In addition, although the separation layer 702 is formed in contact with the substrate 701, an insulating film such as a silicon oxide film, a silicon oxynitride film, a silicon nitride film, or a silicon nitride oxide film may be formed in contact with the substrate 701 as needed, and the separation layer 702 may be formed in contact with the insulating film.

Here, oxynitride refers to a substance that includes more oxygen than nitrogen, and nitride oxide refers to a substance that includes more nitrogen than oxygen. For example, silicon oxynitride is a substance including oxygen, nitrogen, silicon, and hydrogen at concentrations ranging from 50 atomic % to 70 atomic %, inclusive, 0.5 atomic % to 15 atomic %, inclusive, 25 atomic % to 35 atomic %, inclusive, and 0.1 atomic % to 10 atomic %, inclusive, respectively. Furthermore, silicon nitride oxide is a substance including oxygen, nitrogen, silicon, and hydrogen at concentrations ranging from 5 atomic % to 30 atomic %, inclusive, 20 atomic % to 55 atomic %, inclusive, 25 atomic % to 35 atomic %, inclusive, and 10 atomic % to 30 atomic %, inclusive, respectively. Note that the above concentration ranges are obtained when measurements are performed using rutherford backscattering spectrometry (RBS) or hydrogen forward scattering (HFS). In addition, the total of the percentages of the constituent elements does not exceed 100 atomic %.

As the separation layer 702, a metal film, a stacked-layer structure of a metal film and a metal oxide film, or the like can be used. The metal film has a single-layer structure or a stacked-layer structure of a film formed of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir); an alloy material including any of these elements as its main component; or a compound material including any of these elements as its main component. A film of any of those materials can be formed by a sputtering method or any of a variety of CVD methods such as a plasma CVD method. As the a stacked-layer structure of a metal film and a metal oxide film, after the above metal film is formed, oxide or oxynitride of the metal film can be formed on the surface of the metal film by performing plasma treatment in an oxygen atmosphere or an $N_2O$ atmosphere, or heat treatment in an oxygen atmosphere or an $N_2O$ atmosphere. Alternatively, after the metal film is formed, the surface of the metal film may be subjected to treatment with a highly oxidizing solution such as ozone water, whereby oxide or oxynitride of the metal film can be provided on the surface of the metal film.

The insulating film 703 has a single-layer structure or a stacked-layer structure of a film including oxide of silicon or nitride of silicon formed by a sputtering method, a plasma CVD method, or the like. If the insulating film 703 functioning as a base has a two-layer structure, for example, a silicon nitride oxide film may be fin med as a first layer and a silicon oxynitride film may be formed as a second layer. If the insulating film 703 functioning as a base has a three-layer structure, a silicon oxide film, a silicon nitride oxide film, and a silicon oxynitride film may be formed as a first layer, a second layer, and a third layer, respectively. Alternatively, a silicon oxynitride film, a silicon nitride oxide film, and a silicon oxynitride film may be formed as a first layer, a second layer, and a third layer, respectively. The insulating film 703 functioning as a base functions as a blocking film to prevent impurities from entering from the substrate 701.

The semiconductor film 704 is formed by a sputtering method, an LPCVD method, a plasma CVD method, or the like to a thickness of approximately 25 nm to 200 nm, inclusive, preferably approximately 50 nm to 70 nm, inclusive. Specifically, the thickness of the semiconductor film 704 is 66 nm in this embodiment. As the semiconductor film 704, for example, an amorphous silicon film may be formed.

Figure 7B:
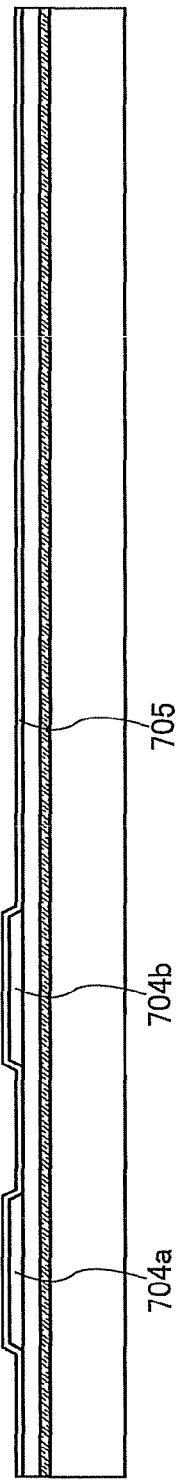

Next, the semiconductor film 704 is irradiated with laser light to be crystallized. Note that the semiconductor film 704 may be crystallized, for example, by combining rapid thermal annealing (RTA), a thermal crystallization method using an annealing furnace, or a thermal crystallization method using a metal element that promotes crystallization, with laser light irradiation. After that, the resulting crystal semiconductor film is etched into a desired shape, whereby a semiconductor film 704a and a semiconductor film 704b are formed. Then, a gate insulating film 705 is formed to cover the semiconductor films 704a and 704b (see FIG. 7B).

An example of a manufacturing step of the semiconductor films 704a and 704b is briefly described below. First, an amorphous semiconductor film (e.g., an amorphous silicon film) is formed by a plasma CVD method. Then, a solution including nickel that is a metal element promoting crystallization is applied over the amorphous semiconductor film, and then the amorphous semiconductor film is subjected to dehydrogenation treatment (at 500° C. for one hour) and thermal crystallization treatment (at 550° C. for four hours), whereby a crystal semiconductor film is formed. Then, the crystal semiconductor film is irradiated with laser light from a laser as needed, depending on the degree of crystallization. Further, the semiconductor films 704a and 704b are formed by a photolithography method. Note that the thermal crystallization using a metal element that promotes crystallization is not necessarily performed and the amorphous semiconductor film may be crystallized only by laser light irradiation.

Alternatively, the semiconductor film may be irradiated with continuous wave laser light or laser light oscillated at a repetition rate of 10 MHz or greater and scanned in one direction for crystallization, whereby the semiconductor films 704a and 704b which are thus crystallized can be obtained. In the case of such crystallization, crystals grow in the laser light scanning direction. A thin film transistor may be provided so that its channel length direction (the direction in which carriers flow when a channel formation region is formed) is aligned with the scanning direction.

Next, the gate insulating film 705 is formed to cover the semiconductor films 704a and 704b. The gate insulating film 705 has a single-layer structure or a stacked-layer structure of a film containing oxide of silicon or nitride of silicon formed by a CVD method, a sputtering method, or the like. Specifically, the gate insulating film 705 has a single-layer structure or a stacked-layer structure of a silicon oxide film, a silicon oxynitride film, or a silicon nitride oxide film.

Alternatively, the gate insulating film 705 may be formed by oxidizing or nitriding the surfaces of the semiconductor films 704a and 704b by plasma treatment. For example, the gate insulating film 705 is fowled by plasma treatment with a mixed gas of a rare gas such as He, Ar, Kr or Xe and oxygen, nitrogen oxide ($NO_2$), ammonia, nitrogen, hydrogen, or the like. In that case, plasma is excited by microwaves, so that plasma with a low electron temperature and a high density can be generated. The surfaces of the semiconductor films can be oxidized or nitrided by oxygen radicals (that may include OH radicals) or nitrogen radicals (that may include NH radicals), which are generated by the high-density plasma.

By treatment with such high-density plasma, an insulating film having a thickness of approximately 1 nm to 20 nm, inclusive, typically approximately 5 nm to 10 nm, inclusive, is formed over the semiconductor films. Since the reaction in that case is a solid-phase reaction, the interface state density between the insulating film and the semiconductor films can be significantly decreased. The semiconductor films (crystalline silicon or polycrystalline silicon) are directly oxidized (or nitrided) by such plasma treatment, whereby variation in thickness of the formed insulating film can be considerably reduced. In addition, oxidation does not proceed at the crystal grain boundaries of crystalline silicon, which makes a very preferable condition. That is, by the solid-phase oxidation of the surfaces of the semiconductor films with the high-density plasma treatment described here, an insulating film with good uniformity and low-interface state density can be formed without excessive oxidation reaction at crystal grain boundaries.

As the gate insulating film 705, only an insulating film formed by the plasma treatment may be used or an insulating film formed of silicon oxide, silicon oxynitride, or silicon nitride may be additionally deposited thereover to be stacked by a CVD method using plasma or thermal reaction. In any case, if an insulating film formed by the plasma treatment are included in a part or the whole of gate insulating films of transistors, variation in characteristics of the transistors can be reduced, which is preferable.

Further, in the case where the semiconductor films 704a and 704b are formed in a manner that a semiconductor film is irradiated with continuous wave laser light or laser light oscillated at a repetition rate of 10 MHz or greater and is scanned in one direction for crystallization, by combining the gate insulating film on which the above plasma treatment is performed and the semiconductor films 704a and 704b, thin film transistors (TFTs) with high field effect mobility and small variation in characteristics can be obtained.

Next, a conductive film is formed over the gate insulating film 705. Here, a single conductive film with a thickness of approximately 100 nm to 500 mm, inclusive, is formed. Examples of a material which can be used for the conductive film include a material containing an element selected from tantalum (Ta), tungsten (W), titanium (Ti), molybdenum (Mo), aluminum (Al), copper (Cu), chromium (Cr), niobium (Nb), and the like; an alloy material mainly including any of these elements; or a compound material mainly including any of these elements. Alternatively, a semiconductor material typified by polycrystalline silicon doped with an impurity element such as phosphorus may be used. In the case where the conductive film has a stacked-layer structure, for example, it is possible to use a stacked-layer structure of a tantalum nitride film and a tungsten film, a stacked-layer structure of a tungsten nitride film and a tungsten film, or a stacked-layer structure of a molybdenum nitride film and a molybdenum film. For example, a stacked-layer structure of a tantalum nitride film having a thickness of 30 nm and a tungsten film having a thickness of 150 nm can be used. Since tungsten and tantalum nitride have high heat resistance, heat treatment for thermal activation can be performed after the conductive film is formed. Alternatively, the conductive film may have a stacked-layer structure of three or more layers, and for example, a stacked-layer structure of a molybdenum film, an aluminum film, and a molybdenum film can be employed.

Next, a resist mask is formed over the above conductive film by a photolithography method and etching treatment is performed for forming a gate electrode and a gate wiring, whereby gate electrodes 707 are formed over the semiconductor films 704a and 704b.

Then, a mask formed of resist is formed by a photolithography method and an impurity element imparting n-type or p-type conductivity is added to the semiconductor films 704a and 704b at a low concentration by an ion doping method or an ion implantation method. In this embodiment, an impurity element imparting n-type conductivity is added to the semiconductor films 704a and 704b at a low concentration. As the impurity element imparting n-type conductivity, an element belonging to Group 15, for example, phosphorus (P) or arsenic (As) can be used. As an impurity element imparting p-type conductivity, an element belonging to Group 13, for example, boron (B) can be used.

Although only n-channel TFTs are described in this embodiment for clarity, the present invention is not limited to this structure. Only p-type TFTs may be used. Alternatively, n-type TFTs and p-type TFTs may be formed in combination. In the case where n-type TFTs and p-type TFTs are formed in combination, an impurity element imparting n-type conductivity is added using a mask covering semiconductor layers that are to be included in the p-type TFTs, and then an impurity element imparting p-type conductivity is added using a mask covering semiconductor layers that are to be included in the n-type TFTs, whereby the impurity element imparting n-type conductivity and the impurity element imparting p-type conductivity can be added as selected.

Next, an insulating film is formed to cover the gate insulating film 705 and the gate electrodes 707. The formed insulating film and the gate insulating film 705 have a single-layer structure or a stacked-layer structure of a film including an inorganic material such as silicon, oxide of silicon, or nitride of silicon, or a film including an organic material such as an organic resin, which is formed by a CVD method, a sputtering method, or the like. Then, the insulating film is selectively etched by anisotropic etching performed mainly in a perpendicular direction, whereby insulating films 708 (also referred to as sidewalls) touching the side surfaces of the gate electrodes 707 are formed. The insulating films 708 are used as masks when an impurity element is added later for forming lightly doped drain (LDD) regions.

Figure 7C:
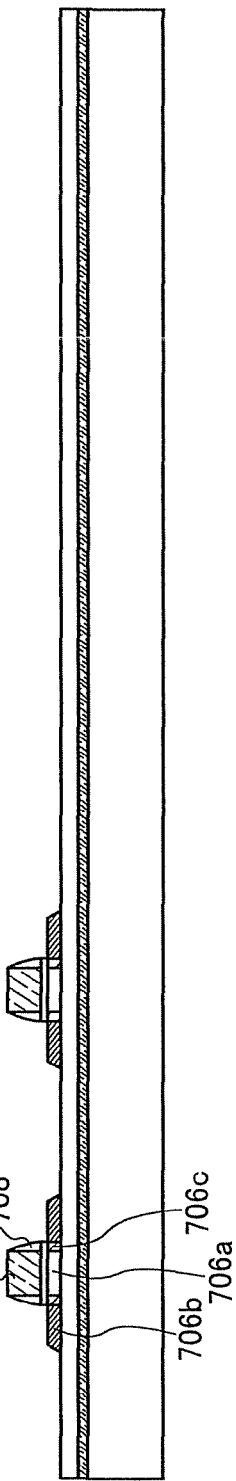

Next, by using the resist mask formed by a photolithography method and the gate electrodes 707 and the insulating film 708 as masks, an impurity element imparting n-type conductivity is added to the semiconductor films 704a and 704b. Thus, a channel formation region 706a, first impurity regions 706b, and second impurity regions 706c are formed (see FIG. 7C). The first impurity regions 706b function as a source and drain regions of a thin film transistor, and the second impurity regions 706c serve as LDD regions. The concentration of the impurity element included in the second impurity regions 706c is lower than that of the impurity element included in the first impurity regions 706b.

Then, an insulating film having a single-layer structure or a stacked-layer structure is formed to cover the gate electrodes 707, the insulating films 708, and the like. In this embodiment, an example is described in which the insulating film has a three-layer structure of insulating films 709, 710, and 711. These insulating films can be formed by a CVD method. For example, a silicon oxynitride film having a thickness of 50 nm, a silicon nitride oxide film having a thickness of 200 nm, and a silicon oxynitride film having a thickness of 400 nm can be formed as the insulating film 709, the insulating film 710, and the insulating film 711, respectively. Surfaces of these insulating films are, although depending on the thicknesses, formed along the surface of the layer provided therebelow. In other words, since the insulating film 709 has a small thickness, the surface of the insulating film 709 closely corresponds to the surfaces of the gate electrodes 707. As the thickness of the film is larger, its surface becomes planar; therefore, the surface of the insulating film 711 whose thickness is the largest of the three films is almost planar. However, the insulating film 711 is not found using an organic material; therefore, the surface of the insulating film 711 is not exactly planar. That is, if it is desired that the surface of the insulating film 711 be planar, an organic material such as polyimide, polyimide, benzocyclobutene, acrylic, or epoxy; a siloxane material; or the like may be used. Further, as a formation method of these insulating films, a sputtering method, an SOG method, a droplet discharge method, a screen printing method, or the like can be employed in addition to a CVD method.

Then, the insulating films 709, 710, and 711, and the like are etched using a photolithography method to form contact holes reaching the first impurity regions 706b. Then, conductive films 731a functioning as source and drain electrodes of the thin film transistors and a conductive film 731b functioning as a connecting wiring are formed. The conductive films 731a and the conductive film 731b can be formed in such a manner: a conductive film is formed so as to fill the contact holes and then the conductive film is selectively etched. Note that before the conductive film is formed, a silicide may be formed over the surfaces of the semiconductor films 704a and 704b that are exposed by the contact holes to reduce resistance. The conductive films 731a and the conductive film 731b are preferably formed using low-resistance material because delay of signals does not occur. Since a low-resistance material often has low heat resistance, a high heat resistance material is preferably provided over and below the low-resistance material. For example, a structure is preferable in which a film of aluminum, which is a low-resistance material, is formed with a thickness of 300 nm and a film of titanium with a thickness of 100 nm is formed over and below the aluminum film. Further, when the conductive film 731*b*, which functioning as a connecting wiring, is formed to have the same stacked-layer structure as the conductive films 731*a*, resistance of the connecting wiring can be lowered and heat resistance of the connecting wiring can be improved. The conductive films 731*a* and the conductive film 731*b* can be formed to have a single-layer structure or a stacked-layer structure using another conductive material, for example: a material including an element selected from tungsten (W), tantalum (Ta), molybdenum (Mo), nickel (Ni), platinum (Pt), copper (Cu), gold (Au), silver (Ag), manganese (Mn), neodymium (Nd), carbon (C), and silicon (Si); an alloy material mainly including any of these elements; or a compound material mainly including any of these elements. An alloy material mainly including aluminum corresponds to, for example, a material which mainly including aluminum and which also includes nickel, or an alloy material which mainly includes aluminum and which also includes nickel and one or both of carbon and silicon. The conductive films 731*a* and the conductive film 731*b* can be formed by a CVD method, a sputtering method, or the like.

Accordingly, an element layer 749 including a thin film transistor 730*a* and a thin film transistor 730*b* can be obtained (see FIG. 8A).

Note that heat treatment for repairing crystallinity of the semiconductor film 704, activating the impurity element which is added to the semiconductor film 704, and hydrogenating the semiconductor film 704 may be performed before the insulating films 709, 710, and 711 are formed; after the insulating film 709 is formed; or after the insulating films 709 and 710 are formed. For the heat treatment, a thermal annealing method, a laser annealing method, an RTA method, or the like may be employed.

Next, insulating films 712 and 713 are formed so as to cover the conductive films 731*a* and the conductive film 731*b* (see FIG. 8B). The case where a silicon nitride film having a thickness of 100 nm is used for the insulating film 712 and a polyimide film having a thickness of 1500 nm is used for the insulating film 713 is described as an example. It is preferable that a surface of the insulating film 713 have high planarity. Therefore, the planarity of the insulating film 713 is improved by making the film have a large thickness of, for example, 750 nm to 3000 nm, inclusive, (specifically, 1500 nm) in addition to the characteristics of polyimide, which is an organic material. An opening portion is formed in the insulating films 712 and 713. In this embodiment, the case where an opening 714 exposing the conductive film 731*b* is formed is described as an example. In the opening 714 (specifically, in a region 715 surrounded by a dotted line), an end portion of the insulating film 712 is covered with the insulating film 713. By covering the end portion of the lower insulating film 712 with the upper insulating film 713, disconnection of a wiring to be formed later in the opening 714 can be prevented. In this embodiment, since the insulating film 713 is formed using polyimide, which is an organic material, the insulating film 713 can have a gently tapered shape in the opening 714, and disconnection can be efficiently prevented. As a material for the insulating film 713 with which such an effect of preventing disconnection can be obtained, an organic material such as polyamide, benzocyclobutene, acrylic, or epoxy; a siloxane material; or the like can be given in addition to polyimide. Further, as the insulating film 712, a silicon oxynitride film or a silicon nitride oxide film may be used instead of the silicon nitride film. As a formation method of the insulating films 712 and 713, a CVD method, a sputtering method, an SOG method, a droplet discharge method, a screen printing method, or the like can be used.

Next, a conductive film 717 is formed over the insulating film 713, and an insulating film 718 is formed over the conductive film 717 (see FIG. 8C). The conductive film 717 can be formed using the same material as the conductive films 731*a* and the conductive film 731*b*, and for example, a stacked-layer structure of a titanium film with a thickness of 100 nm, an aluminum film with a thickness of 200 nm, and a titanium film with a thickness of 100 nm can be employed. Since the conductive film 717 is connected to the conductive film 731*b* in the opening 714, the films formed using titanium are in contact with each other, whereby contact resistance can be suppressed. In addition, since a current based on a signal between the thin film transistor and an antenna (formed later) flows in the conductive film 717, wiring resistance of the conductive film 717 is preferably low. Therefore, a low resistance material such as aluminum is preferably used. The conductive film 717 can be formed to have a single-layer structure or a stacked-layer structure, using another conductive material, for example, a material including an element selected from tungsten (W), tantalum (Ta), molybdenum (Mo), nickel (Ni), platinum (Pt), copper (Cu), gold (Au), silver (Ag), manganese (Mn), neodymium (Nd), carbon (C), and silicon (Si); an alloy material mainly including any of these elements as; or a compound material mainly including any of these elements. An alloy material mainly including aluminum corresponds to, for example, a material which mainly including aluminum and which also includes nickel, or an alloy material which mainly includes aluminum and which also includes nickel and one or both of carbon and silicon. The conductive film 717 can be formed by a CVD method, a sputtering method, or the like. The insulating film 718 should have a planar surface and therefore is preferably formed from an organic material. Here, the case where a polyimide film having a thickness of 2000 nm is used for the insulating film 718 is described as an example. The insulating film 718 is formed to have a thickness of 2000 nm, which is larger than the thickness of the insulating film 713, because projections and depressions formed by the surfaces of the opening 714 of the insulating film 713 having a thickness of 1500 nm and the conductive film 717 formed in the opening 714 should be planarized. Therefore, the insulating film 718 preferably has a thickness 1.1 to 2 times, preferably, 1.2 to 1.5 times the thickness of the insulating film 713. When the insulating film 713 has a thickness of 750 nm to 3000 nm, inclusive, the insulating film 718 preferably has a thickness 900 nm to 4500 nm, inclusive. The insulating film 718 is preferably formed using a material with which planarity can be improved in consideration of the thickness of the insulating film 718. As a material for the insulating film 718 with which the planarity can be improved, an organic material such as polyamide, benzocyclobutene, acrylic, or epoxy; a siloxane material; or the like can be given in addition to polyimide. In the case where an antenna is formed over the insulating film 718, as described above, the planarity of the surface of the insulating film 718 should be taken into consideration.

Figure 12:
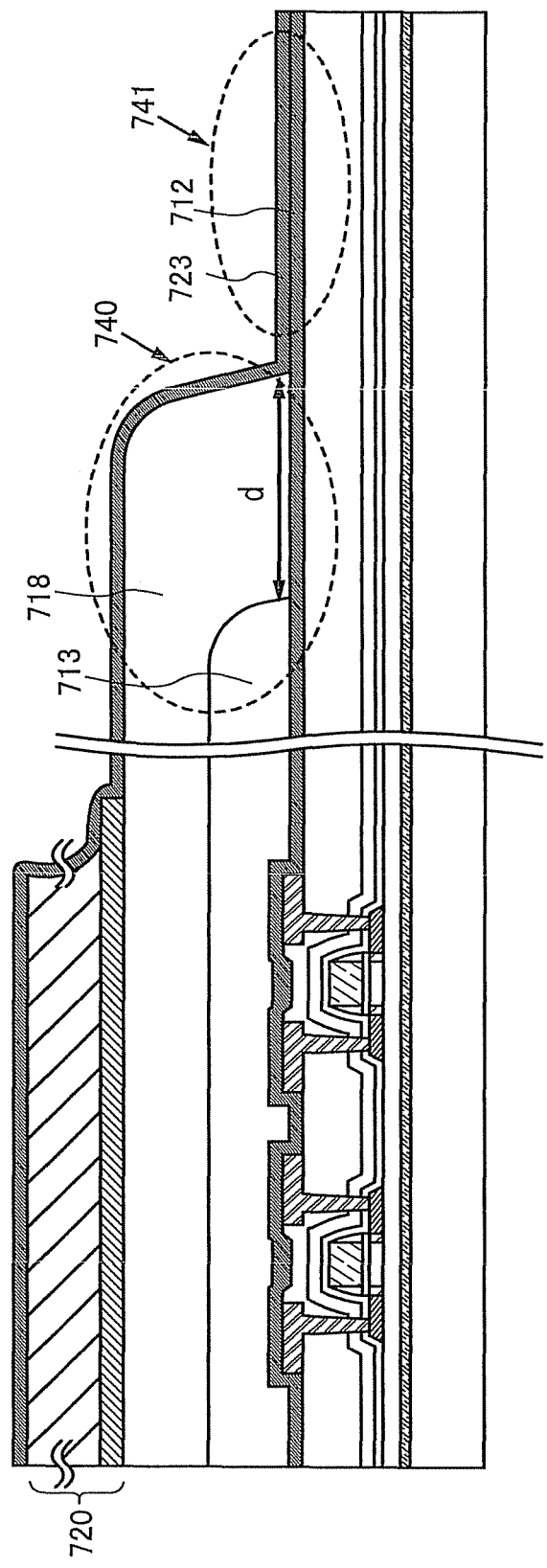
FIG. 12 is a cross-sectional view illustrating a semiconductor device.

FIG. 12 illustrates the peripheral region of the circuit portion. Further, in the circuit portion, the insulating film 718 preferably covers an end portion of the insulating film 713 outside the antenna (specifically, in a region 740). When the insulating film 718 covers the insulating film 713, it is preferable that the end of the insulating film 718 is located away from the end of the insulating film 713 by a distance (a distance d) two or more times as large as the total thickness of the insulating film 713 and the insulating film 718. In this embodiment, since the insulating film 713 is formed to have a thickness of 1500 nm and the insulating film 718 is formed to have a thickness of 2000 nm, the end of the insulating film 718, which covers the end portion of the insulating film 713, is away by a distance d of 7000 nm from the end of the insulating film 713. With such a structure, a margin of a process can be ensured, and further, that entry of moisture and oxygen can be prevented.

Next, an antenna 720 is formed over the insulating film 718 (see FIG. 9A). Then, the antenna 720 and the conductive film 717 are connected to each other through an opening. The opening is provided below the antenna 720 to improve the degree of integration. Note that although the antenna 720 may be directly connected to the conductive films 731a, provision of the conductive film 717 as in this embodiment is preferable because a margin can be secured for formation of the opening for connection with the antenna 720, and high integration can be achieved. Therefore, a conductive film may be further provided over the conductive film 717 to be connected to the antenna 720. That is, the antenna 720 may be electrically connected to the conductive films 731a included in the thin film transistors, and high integration can be achieved with a connection structure through a plurality of conductive films. When the thicknesses of the plurality of conductive films such as the conductive film 717 are large, the semiconductor device is also thickened; therefore, the thicknesses of the plurality of conductive films are preferably small. Therefore, the thickness of the conductive film 717 or the like is preferably smaller than that of the conductive films 731a.

The antenna 720 can employ a stacked-layer structure of a first conductive film 721 and a second conductive film 722. In this embodiment, the case where a stacked-layer structure is formed by using a titanium film with a thickness of 100 nm and an aluminum film with a thickness of 5000 nm is described. Titanium can increase moisture resistance of the antenna, and can increase adhesion between the insulating film 718 and the antenna 720. In addition, contact resistance between the first conductive film 721 and the conductive film 717 can be reduced. This is because titanium is formed for the uppermost layer of the conductive film 717 and the titanium is in contact with titanium of the antenna which is the same material. A titanium film which is employed as the first conductive film 721 is formed by dry etching, so an end portion thereof tends to have a steep angle. Aluminum is a low-resistance material, so it is suitable for the antenna. By forming the second conductive film 722 thickly, resistance can be further lowered. Resistance of the antenna is preferably lowered because a communication distance can be increased. Such an aluminum film is formed by wet etching, so a side surface of the end portion tends to have a tapered shape. The tapered shape in this embodiment is a shape the side surface of which curves toward the inside of the aluminum, that is, a shape having a curved recessed side surface. Further, when the aluminum is wet etched, an end portion of the aluminum is inside the end portion of the titanium (a region 742). For example, it is preferable that the end portion of the aluminum be inside the titanium and the distance between the ends of the aluminum and the titanium be a distance (a distance L) one-sixth to one-half the thickness of the aluminum. In this embodiment, the end of the aluminum may be provided inside the end of the titanium and the distance therebetween may be the distance L of 0.8 μM to 2 μm, inclusive. Since the end portion of the titanium is projected from the end portion of the aluminum, disconnection of an insulating film which is formed later can be prevented, and further, the durability of the antenna can be increased.

The antenna can be formed using, as a conductive material, a material including a metal element such as silver, copper, gold, platinum, nickel, palladium, tantalum, or molybdenum; an alloy material including any of these metal elements; or a compound material including any of these metal elements, in addition to aluminum and titanium. As the formation method of the antenna, a CVD method, a sputtering method, a printing method such as screen printing or gravure printing, a droplet discharge method, a dispenser method, a plating method, or the like can be given. Although a stacked-layer structure is described as an example in this embodiment, a single-layer structure of any of the above materials may be employed.

An insulating film 723 is formed so as to cover the antenna 720. In this embodiment, a silicon nitride having a thickness of 200 nm is used for the insulating film 723. The insulating film 723 is preferably provided because the moisture resistance of the antenna can be further increased. Since the end portion of the titanium film is projected from the end portion of the aluminum film, the insulating film 723 can be formed without disconnection. The insulating film 723 as described above can be formed using a silicon oxynitride film, a silicon nitride oxide film, or another inorganic material in addition to the silicon nitride film.

Additionally, as illustrated in FIG. 12, the insulating film 723 and the insulating film 712 are preferably in contact with each other outside the insulating film 718, that is, outside the antenna in the circuit portion (specifically, a region 741). In this embodiment, both of the insulating films 712 and 723 are silicon nitride films. Since the parts formed from the same material are closely in contact with each other, the adhesion is high and entry of moisture and oxygen can be efficiently prevented. Further, a silicon nitride film is denser than a silicon oxide film and thus can effectively prevent entry of moisture and oxygen. The region in which the insulating films 712 and 723 are closely in contact with each other is the peripheral region, which is not provided with the antenna or the thin film transistor, and therefore, has a very small thickness of 3 μm to 4 μm, inclusive. The peripheral region is fanned to surround the circuit portion. With compared to a semiconductor device which does not employ such a structure of a peripheral region, the semiconductor device of this embodiment can have reduced defects caused by a change over time in shape and characteristics, such as peeling at the end portion of the semiconductor device.

Then, a first insulator 751 is formed so as to cover the insulating film 723 (see FIG. 9B). In this embodiment, a structure body 726 in which a fibrous body 727 is impregnated with an organic resin 728 is used as the first insulator 751. Further, the case where a first impact attenuating layer 750 is provided on a surface of the structure body 726 is shown as a preferred example. In this embodiment, an aramid resin is used for the first impact attenuating layer 750.

The structure body 726 in which the fibrous body 727 is impregnated with the organic resin 728 is also referred to as a prepreg. A prepreg is formed specifically in such a manner that a fibrous body is impregnated with varnish in which a matrix resin is diluted with an organic solvent, and then the organic solvent is volatilized and the matrix resin is semi-cured. A prepreg has a modulus of elasticity of 13 GPa to 15 GPa, inclusive, and a modulus of rupture of 140 MPa. By using the prepreg which is formed into a thin film, a thin semiconductor device capable of being curved can be manufactured. As typical examples of a fibrous body for a prepreg, a polyvinyl alcohol fiber, a polyester fiber, a polyamide fiber, a polyethylene fiber, an aramid fiber, a polyparaphenylene benzobisoxazole fiber, a glass fiber, and carbon fiber are given. As typical examples of a resin which is used for forming a matrix resin, an epoxy resin, an unsaturated polyester resin, a polyimide resin, and a fluorine resin are given. Note that the prepreg will be described in detail in an embodiment below.

In addition to the structure body 726, the first insulator 751 can include a layer including a thermosetting resin such as an epoxy resin, an unsaturated polyester resin, a polyimide resin, a bismaleimide-triazine resin, or a cyanate resin. Alternatively, a thermoplastic resin such as a polyphenylene oxide resin, a polyetherimide resin, or a fluorine resin may be used for the first insulator 751. Further, the impact attenuating layer 750 is preferably formed from a high-strength material. Examples of the high-strength material include a polyvinyl alcohol resin, a polyester resin, a polyamide resin, a polyethylene resin, or a polyparaphenylene benzobisoxazole resin, and a glass resin, as well as an aramid resin.

The thickens of the first insulator 751 is 5 µm to 100 µm, inclusive, preferably, µm to 50 µm, inclusive. In this embodiment, the thickness of the first insulator 751 is 32 µm. In the first insulator 751 in this embodiment, the thickness of the structure body 726 and the thickness of the first impact attenuating layer 750 is 20 µm and 12 µm, respectively. With such a structure, a thin semiconductor device capable of being curved can be manufactured.

After the first impact attenuating layer 750 is formed, a first conductive layer 729 is formed on a surface of the first impact attenuating layer 750. An example in which film of a compound of silicon oxide and indium tin oxide with a thickness of 100 nm is used as the first conductive layer 729 is described. The above first conductive layer 729 is acceptable as long as it has lower resistance than the structure body 726 and the first impact attenuating layer 750. Accordingly, the first conductive layer 729 may be a film or a group of islands arranged with small gaps therebetween. In addition, since the resistance of the first conductive layer 729 is preferably low, the thickness thereof can be 50 nm to 200 nm, inclusive, in consideration of specific resistance or the like of the material which is used. If the first conductive layer 729 has an increased thickness, the resistance can be lowered, which is preferable. The first conductive layer 729 can be formed using, as well as a compound of silicon oxide and indium tin oxide, a material including an element selected from titanium, molybdenum, tungsten, aluminum, copper, silver, gold, nickel, tin, platinum, palladium, iridium, rhodium, tantalum, cadmium, zinc, iron, silicon, germanium, zirconium, and barium; an alloy material mainly including any of these above elements; a compound material mainly including any of these above elements; or the like. The first conductive layer 729 can be formed by a sputtering method, a plasma CVD method, a coating method, a printing method, or the like. Alternatively, a plating method such as an electrolytic plating method or an electroless plating method may be used. Note that an insulating film may be formed on the surface of the first conductive layer 729 so that the first conductive layer 729 can be protected. With the insulating film, the first conductive layer 729 can be protected.

Figure 10:
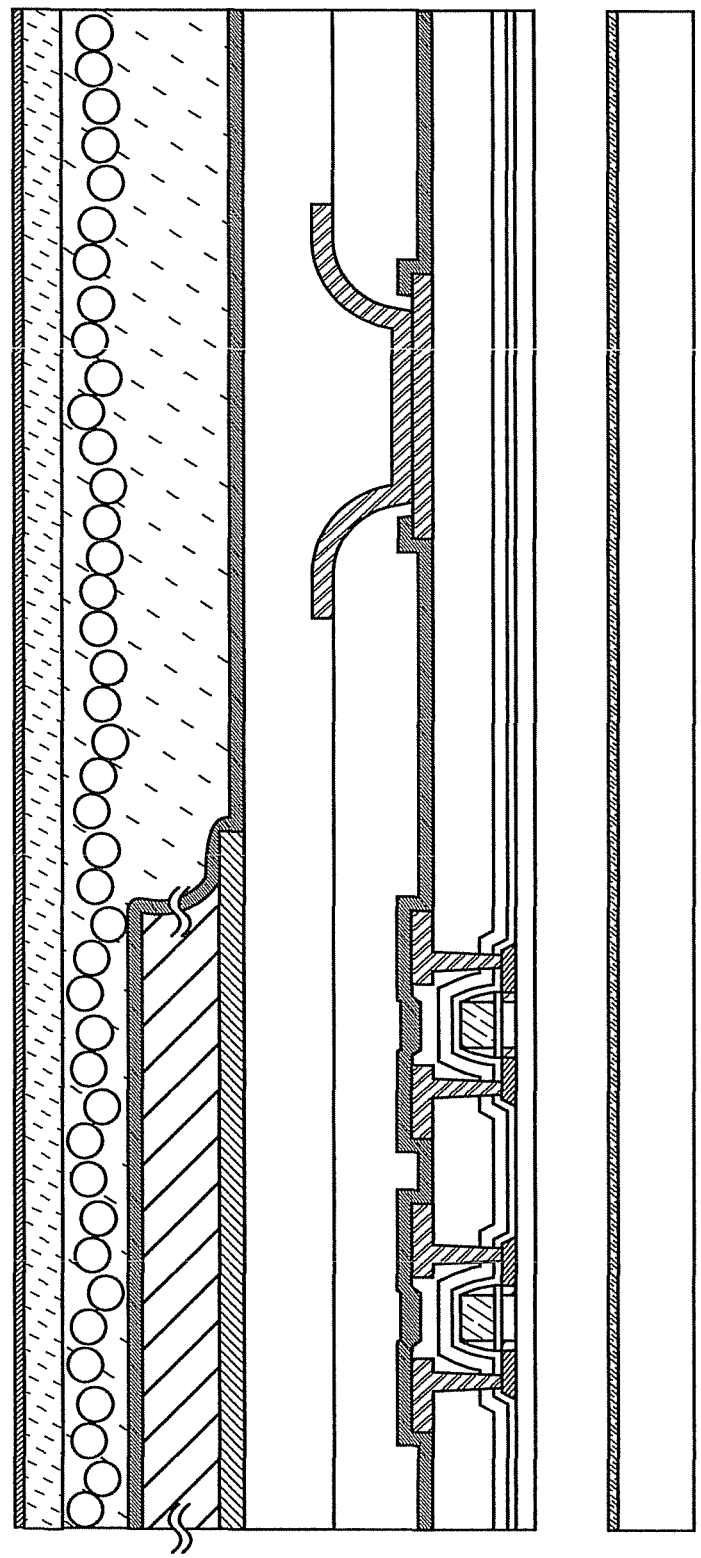
FIG. 10 is a cross-sectional view illustrating a method for manufacturing a semiconductor device.

Next, a layer including the element layer including the thin film transistors 730a and 730b, the conductive film functioning as the antenna 720, and the like is separated from the substrate 701 (see FIG. 10). At this time, separation is performed at an interface between the separation layer 702 and the substrate 701, an interface between the separation layer 702 and the insulating film 703, or the inside of the separation layer 702, whereby the layer including the element layer including the thin film transistors 730a and 730b, the conductive film serving as the antenna 720, and the like is released.

If the separation layer 702 unnecessarily remains on the released layer, the separation layer 702 may be removed by etching or the like. As a result, adhesion between the insulating film 703 and a layer to be formed later can be heightened.

Note that the separation is preferably performed while wetting a separation surface with water or a solution such as ozone water, so that the elements such as the thin film transistors 730a and 730b can be prevented from being broken due to static electricity and the like. This is because an unpaired electron in the separation layer 702 is terminated due to ions in the solution, so that electrical is neutralized.

In addition, cost can be reduced by reusing the substrate 701 after the separation.

Figure 11:
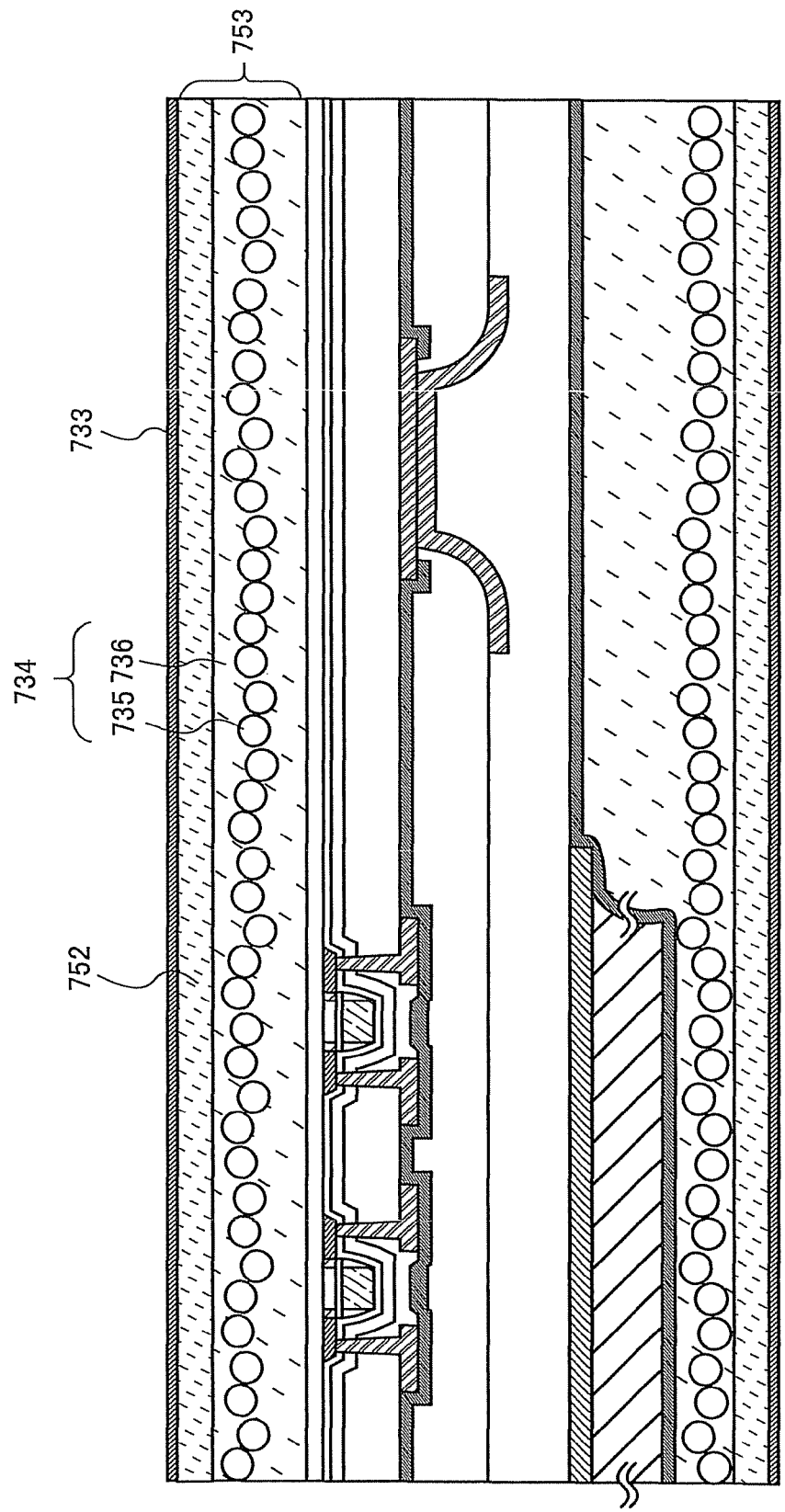
FIG. 11 is a cross-sectional view illustrating a method for manufacturing a semiconductor device.

Next, a second insulator 753 is formed so as to cover the surface exposed by the separation (see FIG. 11). The second insulator 753 can be formed in a similar manner to the first insulator 751. In this embodiment, the case is described in which, as the second insulator 753, a structure body 734 using a so-called prepreg in which a fibrous body 735 is impregnated with an organic resin 736 is provided and further, a second impact attenuating layer 752 is provided on a surface of the structure body 734. An aramid resin is used for the second impact attenuating layer 752. Needless to say, only the structure bodies 726 and 734 can be bonded together. In that case, the thickness of the semiconductor device will be 40 µm to 70 µm, preferably, 40 µm to 50 µm. The thickness of the semiconductor device provided with the first and second impact attenuating layers is 70 µm to 90 µm, preferably, 70 µm to 80 µm.

Next, a second conductive layer 733 is formed on the surface of the second insulator 753. The second conductive layer 733 can be formed in a manner similar to the first conductive layer 729. Note that an insulating film may be formed on the surface of the second conductive layer 733 so that the second conductive layer 733 can be protected. Through the above steps, a layered body can be obtained in which the element layer and the antenna are sealed between the first insulator 751 and the second insulator 753, the first conductive layer 729 is formed on the surface of the first insulator 751, and the second conductive layer 733 is formed on the surface of the second insulator 753.

Then, the layered body is cut with a cutting means into separate semiconductor devices. As the cutting means, it is preferable to use a means which melts the first insulator 751 and the second insulator 753 in the cut (it is more preferable to use a means which melts the first conductive layer 729 and the second conductive layer 733). In this embodiment, laser light irradiation is used for the cut.

There is no particular limitation on the conditions, such as wavelength, intensity, and beam size of the laser light used for the above cut. The laser light irradiation may be performed under such conditions that the division can be performed. As a laser, it is possible to use, for example, a continuous-wave laser such as an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, or a helium-cadmium laser; or a pulsed laser such as an Ar laser, a Kr laser, an excimer (ArF, KrF, or XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a copper vapor laser, or a gold vapor laser.

As described in this embodiment, by cutting the semiconductor device into separate semiconductor devices by laser light irradiation, the resistance value between the first conductive layer 729 and the second conductive layer 733 is decreased, whereby conduction between the first conductive layer 729 and the second conductive layer 733 is achieved. Accordingly, the step of cutting the semiconductor device and the step of achieving conduction between the first conductive layer 729 and the second conductive layer 733 can be performed at a time.

The value of resistance between the first conductive layer 729 and the second conductive layer 733 should be lower than that of the first insulator 751 and that of the second insulator 753. The value of resistance between the first conductive layer 729 and the second conductive layer 733 may be, for example, 1 GΩ or less, preferably approximately 5 MΩ to 500 MΩ, inclusive, and more preferably approximately 10 MΩ to 200 MΩ, inclusive. Therefore, the semiconductor device may be cut with laser light irradiation or the like so that the above condition can be obtained.

In the above manner, semiconductor devices which are formed by using an insulating substrate can be completed.

This embodiment can be combined as appropriate with any of other embodiments.

[Embodiment 5]

In this embodiment, one mode of a separation step of a semiconductor device. Description of the separation step is made using FIG. 13 and FIG. 14 each illustrating a portion between semiconductor devices, that is, a periphery portion.

Figure 13:
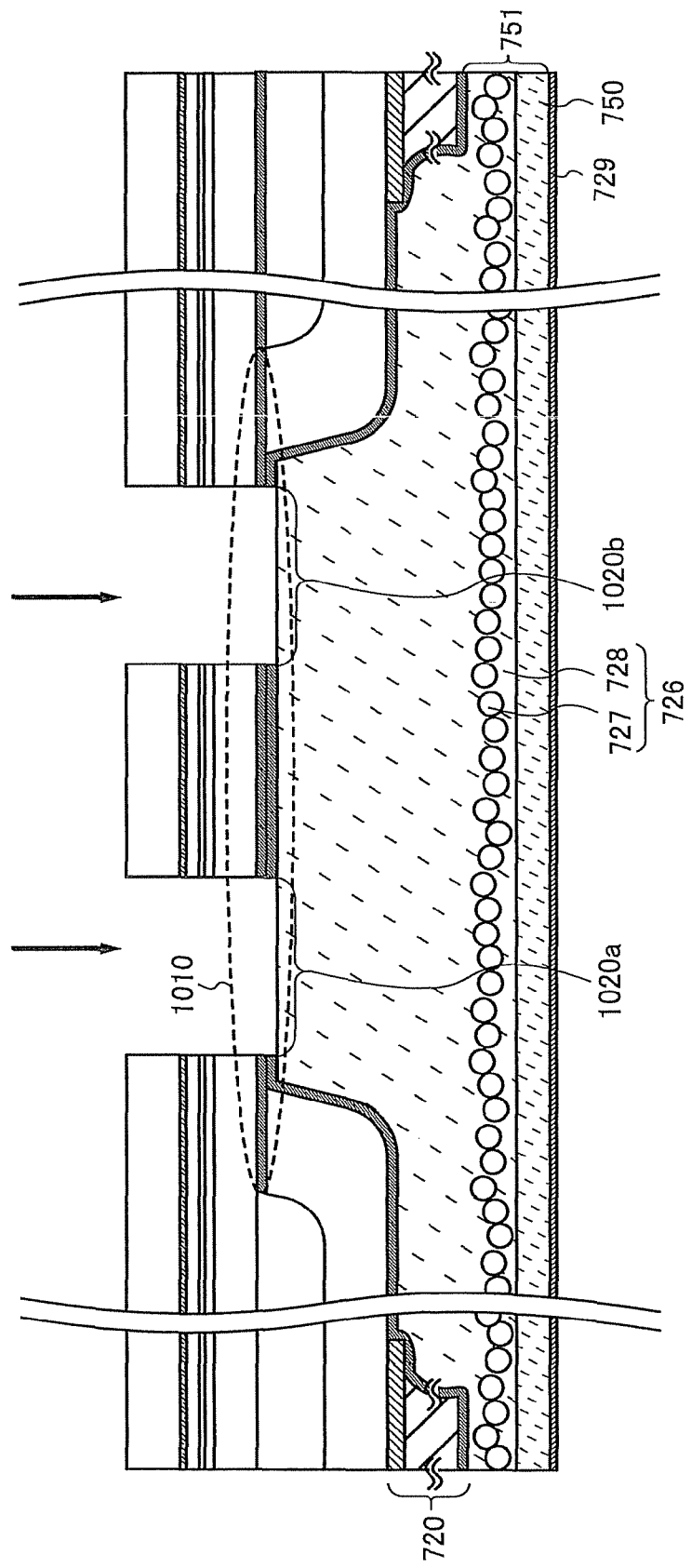
FIG. 13 is a cross-sectional view illustrating a separation step of a semiconductor device.

First, as described above embodiment, steps are performed by formation of the first insulator 751 and the first conductive layer 729. Then, as illustrated in FIG. 13, bonding regions 1020a and 1020b are selectively formed in a peripheral region 1010, that is, in part of the peripheral region 1010 with the use of a removing means. When the peripheral region 1010 is selectively removed, in a depth direction, the separation layer, the insulating film, and the like are removed so that the structure body 726 is exposed. Then, the bonding regions 1020a and 1020b are funned so as to surround the circuit portion.

A laser beam can be used for such a removing means. In other words, the principle of laser ablation can be employed. There is no particular limitation on the conditions such as the wavelength, the intensity, and the size of the laser beam used for the removing means. The conditions are acceptable as long as the separation layer, the insulating film, and the like can be removed at least. As a laser, for example, the following laser can be used: the continuous wave laser, such as an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an Alexandrite laser, a Ti:sapphire laser, and a helium-cadmium laser; a pulsed laser such as Ar laser, a Kr laser, an excimer (ArF, KrF, or XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an Alexandrite laser, a Ti:sapphire laser, a copper vapor laser, a gold vapor laser.

After the semiconductor device is cut into separate semiconductor devices, the bonding regions 1020a and 1020b are separately included in the neighboring semiconductor devices. Similarly, the peripheral region 1010 becomes the peripheral regions 1010a and 1010b which are separately included in the neighboring semiconductor devices after the semiconductor device is cut into separate semiconductor devices (see FIG. 14).

Figure 14:
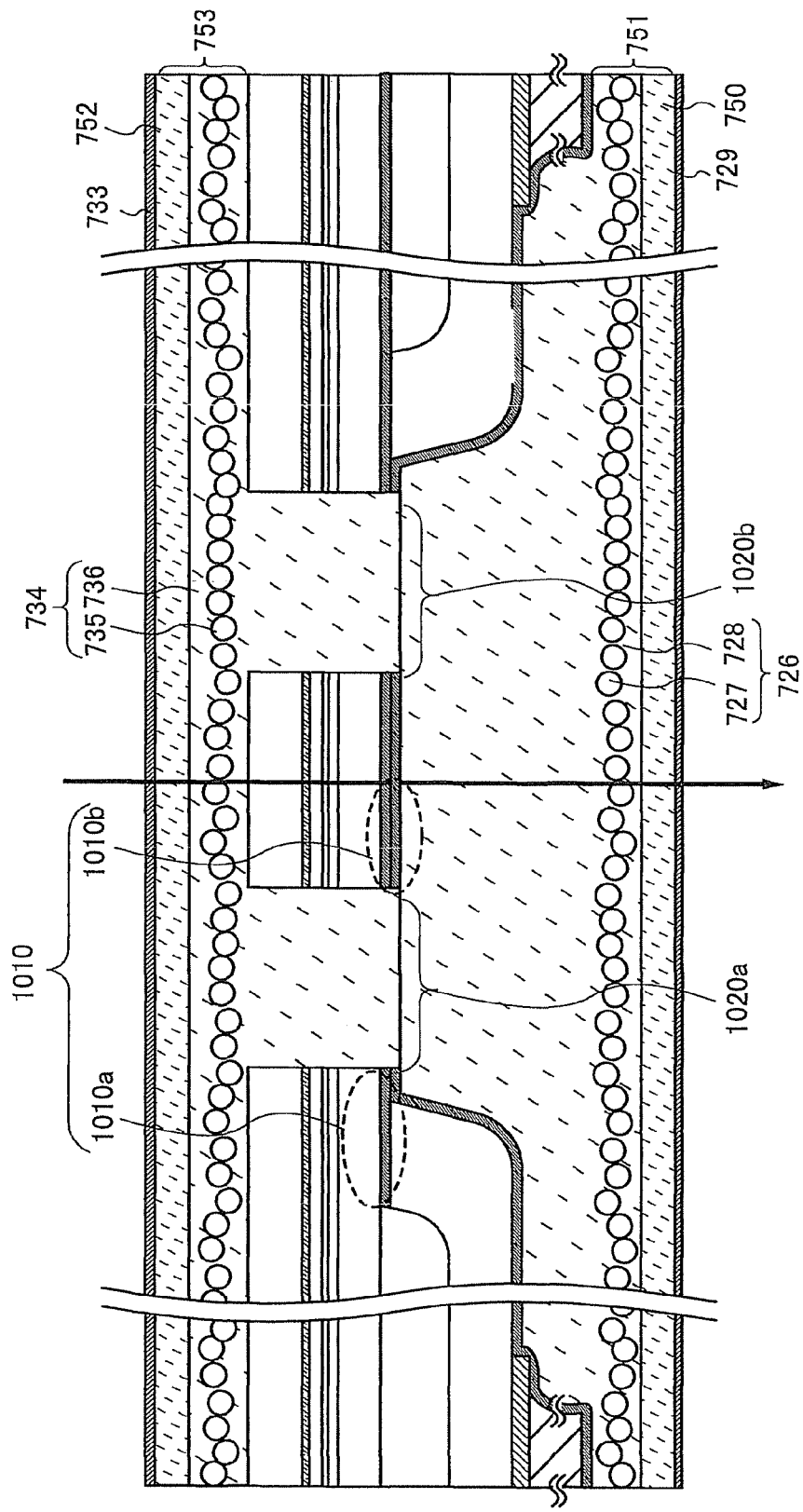
FIG. 14 is a cross-sectional view illustrating a separation step of a semiconductor device.

Then, as illustrated in FIG. 14, a second insulator 753 and a second conductive layer 733 are formed. In the bonding regions 1020a and 1020b, the structure bodies 726 and 734 are directly bonded together. In specific, the organic resin 728 of the structure body 726 and the organic resin 732 of the structure body 734 are closely in contact with each other. The parts formed from the same materials are closely in contact with each other in such a manner, whereby bonding strength is heightened, which is preferable.

After the bonding is completed, the semiconductor device is cut into separate semiconductor devices. The above embodiments can be referred to for the details of the cutting means.

In the above manner, semiconductor devices with high bonding strength and improved reliability which are formed using an insulating substrate can be completed.

This embodiment can be implemented in combination with any of the other embodiments as appropriate.

[Embodiment 6]

FIGS. 15A and 15B show timing charts of an operation example of the memory circuit in Embodiment 1. Here, "on" indicates that absence of supply of a power supply voltage is change to presence of supply of a power supply voltage; "off" indicated that presence of supply of the power supply voltage is change to absence of supply of the power supply voltage. In FIG. 15A, supply of the power supply voltage is on at all the time. In FIG. 15B, supply of the power supply voltage is on and then off. After that, supply of the power supply voltage is on again.

In each of FIGS. 15A and 15B, timing of a power supply voltage which is a power supply voltage supplied to the entire circuit from the upper side to the lower side (see 151 in FIGS. 15A and 15B), timing of a writing voltage which is input to a terminal 104 which selects data at the time of writing (see 152 in FIGS. 15A and 15B), timing of an input voltage which is input to the terminal 106 which inputs a voltage corresponding to data "1" or data "0" (see 153 in FIGS. 15A and 15B), timing of a capacitor voltage which is a voltage between terminals of the capacitor 102 (see 154 in FIGS. 15A and 15B), and timing of an output voltage which is output to the terminal 108 which outputs the data written (see 155 in FIGS. 15A and 15B) are shown.

FIG. 15A is described below. When supply of the power supply voltage is on (see 160 in FIG. 15A), and the writing voltage and the input voltage are change from low voltages to high voltages, electric current flows into the capacitor 102 and the capacitor voltage becomes a high voltage. When the capacitor voltage is high, the output of the buffer 105 becomes high and then output voltage becomes high. After that, when the writing voltage and the input voltage are changed from high voltages to low voltages, electric current flows from the resistor 103 that is a current path, so that the amount of electric charge of the capacitor 102 is reduced. Accordingly, the capacitor voltage is lowered. Then, when the capacitor voltage becomes lower than the inverting voltage of the buffer 105, the output of the buffer 105 has low voltage and then the output voltage becomes low. By the resistance value of the resistor 103, the period during which the output voltage is changed from a high voltage to a low voltage can be kept equal to a predetermined time determined by the discharge time of the capacitor.

FIG. 15B is described below. When supply of the power supply voltage is on (see 161 in FIG. 15B), and the writing voltage and the input voltage are change from low voltages to high voltages, electric current flows into the capacitor 102 and the capacitor voltage becomes high. When the capacitor voltage is high, the output of the buffer 105 becomes high and then output voltage becomes high. After that, when the writing voltage and the input voltage are changed from high voltages to low voltages, electric current flows from the resistor 103 that is a current path, so that the amount of electric charge in the capacitor 102 is reduced. Accordingly, the capacitor voltage is lowered. Then, when supply of the power supply voltage is off (see 162 in FIG. 15A), the output voltage is lowered. Since current flows via the resistor 103, the capacitor voltage is lowered even though the power supply voltage is off. After that, supply of the power supply voltage is on again. When the capacitor voltage is higher than the inverting voltage of the buffer 105, the output voltage becomes a high voltage. Then, when the capacitor voltage becomes lower than the inverting voltage of the buffer 105, the output of the buffer 105 has low voltage and then the output voltage becomes a low voltage. By the resistance value of the resistor 103, the period during which the output voltage is changed from a high voltage to a low voltage can be kept equal to a predetermined time determined by the discharge time of the capacitor.

Accordingly, regardless of presence or absence of supply of a power supply voltage, the period during which the output voltage is changed from a high voltage to a low voltage can be kept equal to a predetermined time determined by the discharge time of the capacitor.

[Embodiment 7]

In this embodiment, an example of a mask layout of the semiconductor device described in the above embodiment is described.

Figure 16:
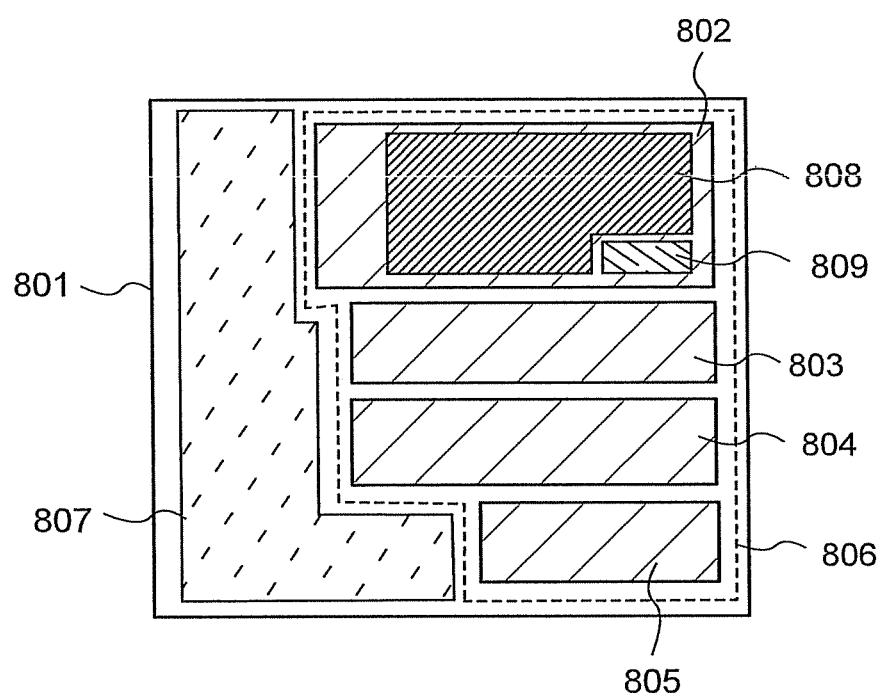
FIG. 16 each shows Embodiment 7.

FIG. 16 illustrates this embodiment. FIG. 16 is a block diagram of arrangement of a memory circuit portion 801, memories 802, 803, 804, and 805 which correspond to the memories described in the above embodiments, a memory region 806, a control circuit portion 807, a capacitor 808, and a diode 809.

In the memory circuit portion 801, the control circuit portion 807 is provided and the memory region 806 is provided next to the control circuit portion 807. In part of the memory region 806, the memories 802, 803, 804, and 805 which are described in the above embodiment are provided so as to be next to each other. In part of the memory 802 described in the above embodiment, the capacitor 808 and the diode 809 are provided so as to be next to each other.

Figure 17:
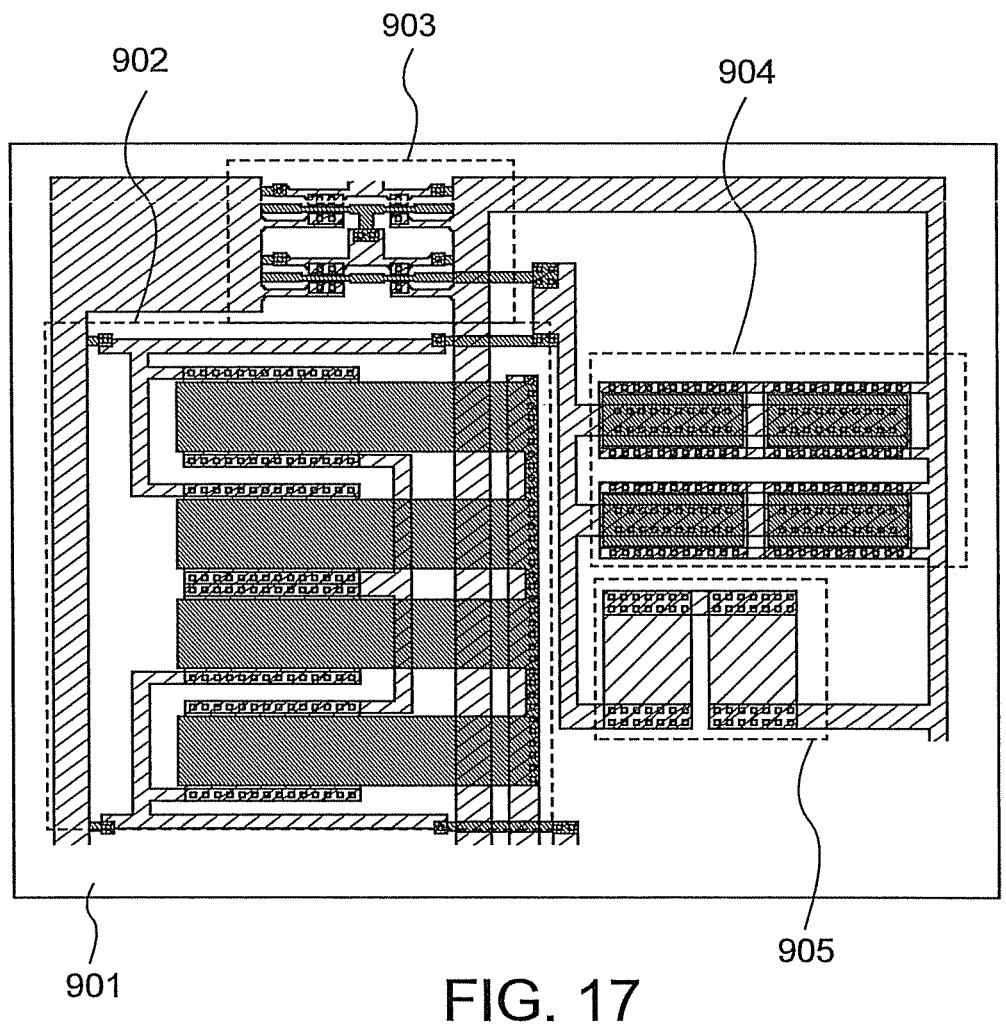
FIG. 17 is a diagram illustrating an embodiment of the present invention.

In addition, FIG. 17 illustrates an example of a mask layout of the circuit diagram in Embodiment 1. In FIG. 17, an example of arrangement of a semiconductor memory region 901, an n-channel transistor 902, a buffer 903, a capacitor 904, and a resistor 905 which are described in the above embodiment is illustrated.

As for correspondence with the circuit diagram of Embodiment 1, the n-channel transistor 902, the buffer 903, and the capacitor 904 correspond to the n-channel transistor 101, the capacitor 102, and the resistor 103, respectively, and are provided so as to be next to each other.

Note that the mask layout in this embodiment can be employed when the structure described in the above embodiment is implemented.

This application is based on Japanese Patent Application serial no. 2008-257339 filed with Japan Patent Office on Oct. 2, 2008, the entire contents of which are hereby incorporated by reference.

REFERENCE NUMERALS

101: transistor, 102: capacitor, 103: resistor, 104: terminal, 105: buffer, 106 to 108: terminals, 201: transistor, 202: capacitor, 203: diode, 204: terminal, 205: buffer, 206 to 208: terminals, 303: diode-connected transistor, 401: transistor, 402: capacitor, 403: reference potential. 404: bit line, 405: word line, 406: memory cell, 500: RFID tag, 501: antenna circuit, 503: rectifier circuit, 504: power supply circuit, 505: demodulation circuit, 506: oscillator circuit, 507: logic circuit, 508: memory control circuit, 509: memory circuit, 510: logic circuit, 511: amplifier, 512: modulation circuit, 561: battery, 701: substrate, 702: separation layer, 703: insulating film, 704: semiconductor film, 704a and 704b: semiconductor films, 705: gate insulating film, 706a: channel formation region, 706b: first impurity region, 706c: second impurity region, 707: gate electrode, 708: insulating film, 709 to 711: insulating films, 712 and 713: insulating films, 714: opening, 715: region, 717: conductive film, 718: insulating film, 720: antenna, 721: first conductive film, 722: second conductive film, 723: insulating film, 726: structure body, 727: fibrous body, 728: organic resin, 729: first conductive layer, 730a and 730b: thin film transistors, 731a and 731b: conductive films, 733: second conductive layer, 734: structure body, 735: fibrous body, 736: organic resin, 740 to 742: regions, 750: first impact attenuating layer: 751: first insulator, 752: second impact attenuating layer, 753: second insulator, 801: memory circuit portion, 802 to 805: memories, 806: memory region, 807: control circuit portion, 808: capacitor, 809: diode, 901: semiconductor memory region, 902: transistor, 903: buffer, 904: capacitor, 905: resistor, 1010: peripheral region, 1010a and 1010b: peripheral regions, and 1020a and 1020b: bonding regions.

The invention claimed is:

1. A semiconductor device including a memory cell, the memory cell comprising:
   a transistor, a gate of the transistor being electrically connected to a word line, and one of a source and a drain of the transistor being electrically connected to a bit line;
   a capacitor, one terminal of the capacitor being electrically connected to the other of the source and the drain of the transistor, and the other terminal of the capacitor being electrically connected to a wiring;
   a resistor, one terminal of the resistor being electrically connected to the other of the source and the drain of the transistor, and the other terminal of the resistor being electrically connected to the wiring; and
   a buffer circuit electrically connected to the other of the source and the drain of the transistor,
   wherein the one terminal of the resistor is between the one terminal of the capacitor and an input of the buffer circuit, and
   wherein an amount of electric charge which is discharged from the capacitor and flows to the resistor is larger than an amount of electric charge which is discharged from the capacitor and flows to the transistor.

2. The semiconductor device according to claim 1, wherein when a potential of the gate of the transistor and a potential of the one of the source and the drain of the transistor is equal to a potential of the other terminal of the capacitor, the amount of electric charge which is discharged from the capacitor and flows to the resistor is larger than the amount of electric charge which is discharged from the capacitor and flows to the transistor.

3. The semiconductor device according to claim 1, further comprising an antenna circuit which transmits/receives a signal wirelessly, and wherein the memory cell is kept data based on the signal.

4. The semiconductor device according to claim 1, wherein an electric charge discharged from the capacitor is capable of flowing to the transistor and the resistor.

5. A semiconductor device including a memory cell, the memory cell comprising:
   a transistor, a gate of the transistor being electrically connected to a word line, and one of a source and a drain of the transistor being electrically connected to a bit line;
   a capacitor, one terminal of the capacitor being electrically connected to the other of the source and the drain of the transistor, and the other terminal of the capacitor being electrically connected to a wiring;

a diode, one terminal of the diode being electrically connected to the other of the source and the drain of the transistor, and the other terminal of the diode being electrically connected to the wiring; and a buffer circuit electrically connected to the other of the source and the drain of the transistor, wherein the one terminal of the diode is between the one terminal of the capacitor and an input of the buffer circuit.

6. The semiconductor device according to claim 5, wherein an amount of electric charge which is discharged from the capacitor and flows to the diode is larger than an amount of electric charge which is discharged from the capacitor and flows to the transistor.

7. The semiconductor device according to claim 5, wherein when a potential of the gate of the transistor and a potential of the one of the source and the drain of the transistor is equal to a potential of the other terminal of the capacitor, an amount of electric charge which is discharged from the capacitor and flows to the diode is larger than an amount of electric charge which is discharged from the capacitor and flows to the transistor.

8. The semiconductor device according to claim 5, further comprising an antenna circuit which transmits/receives a signal wirelessly, and wherein the memory cell is kept data based on the signal.

9. The semiconductor device according to claim 5, wherein an electric charge discharged from the capacitor is capable of flowing to the transistor and the diode.

10. The semiconductor device according to claim 5, wherein the diode is a second transistor, and wherein a gate of the second transistor is electrically connected to one of a source and a drain of the second transistor.

* * * * *